(12) United States Patent
Itakura

(10) Patent No.: US 11,233,048 B2
(45) Date of Patent: Jan. 25, 2022

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Kenji Itakura, Kawasaki (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 389 days.

(21) Appl. No.: 16/354,482

(22) Filed: Mar. 15, 2019

(65) Prior Publication Data
US 2020/0091141 A1 Mar. 19, 2020

(30) Foreign Application Priority Data
Sep. 19, 2018 (JP) .............................. JP2018-174528

(51) Int. Cl.
*H01L 23/62* (2006.01)
*H01L 27/07* (2006.01)
(Continued)

(52) U.S. Cl.
CPC .......... *H01L 27/0711* (2013.01); *H01L 23/13* (2013.01); *H01L 23/3121* (2013.01); *H01L 25/072* (2013.01); *H01L 29/7393* (2013.01)

(58) Field of Classification Search
CPC ... H01L 23/13; H01L 23/3121; H01L 25/072; H01L 27/0711; H01L 29/7393
(Continued)

(56) References Cited

U.S. PATENT DOCUMENTS

2017/0256483 A1* 9/2017 Matsuyama ............ H01L 24/49
2017/0345917 A1 11/2017 Basler et al.

FOREIGN PATENT DOCUMENTS

EP 1 030 354 A1 8/2000
JP 2000-310173 A 11/2000
(Continued)

*Primary Examiner* — Samuel A Gebremariam
*Assistant Examiner* — Vernon P Webb
(74) *Attorney, Agent, or Firm* — Oblon, McClelland, Maier & Neustadt, L.L.P.

(57) ABSTRACT

According to an embodiment, a semiconductor device includes a first electrically conductive portion, a first semiconductor chip of a reverse-conducting insulated gate bipolar transistor, a second electrically conductive portion, a third electrically conductive portion, a second semiconductor chip of an insulated gate bipolar transistor, and a fourth electrically conductive portion. The first semiconductor chip includes a first electrode and a second electrode. The first electrode is electrically connected to the first electrically conductive portion. The second electrically conductive portion is electrically connected to the second electrode. The third electrically conductive portion is electrically connected to the first electrically conductive portion. The second semiconductor chip includes a third electrode and a fourth electrode. The third electrode is electrically connected to the third electrically conductive portion. The fourth electrically conductive portion is electrically connected to the fourth electrode and the second electrically conductive portion.

9 Claims, 29 Drawing Sheets

(51) Int. Cl.
*H01L 25/07* (2006.01)
*H01L 23/31* (2006.01)
*H01L 23/13* (2006.01)
*H01L 29/739* (2006.01)

(58) Field of Classification Search
USPC .................................................. 257/365–371
See application file for complete search history.

(56) References Cited

FOREIGN PATENT DOCUMENTS

| | | |
|---|---|---|
| JP | 2002-151646 A | 5/2002 |
| JP | 3973832 | 9/2007 |
| JP | 4234614 | 3/2009 |
| WO | WO 99/12197 | 3/1999 |

\* cited by examiner

SEMICONDUCTOR DEVICE

CROSS-REFERENCE TO RELATED APPLICATIONS

This application is based upon and claims the benefit of priority from Japanese Patent Application No. 2018-174528, filed on Sep. 19, 2018; the entire contents of which are incorporated herein by reference.

FIELD

Embodiments described herein relate generally to a semiconductor device.

BACKGROUND

There is a semiconductor device including a reverse-conducting insulated gate bipolar transistor (RC-IGBT) semiconductor chip. The RC-IGBT has the function of an insulated gate bipolar transistor (IGBT) and the function of a diode connected in anti-parallel with the IGBT. It is desirable to reduce the power consumption of the semiconductor device.

BRIEF DESCRIPTION OF THE DRAWINGS

FIGS. 17A and 17B are cross-sectional views illustrating operations of the semiconductor device according to the reference example;

DETAILED DESCRIPTION

Figure 1:
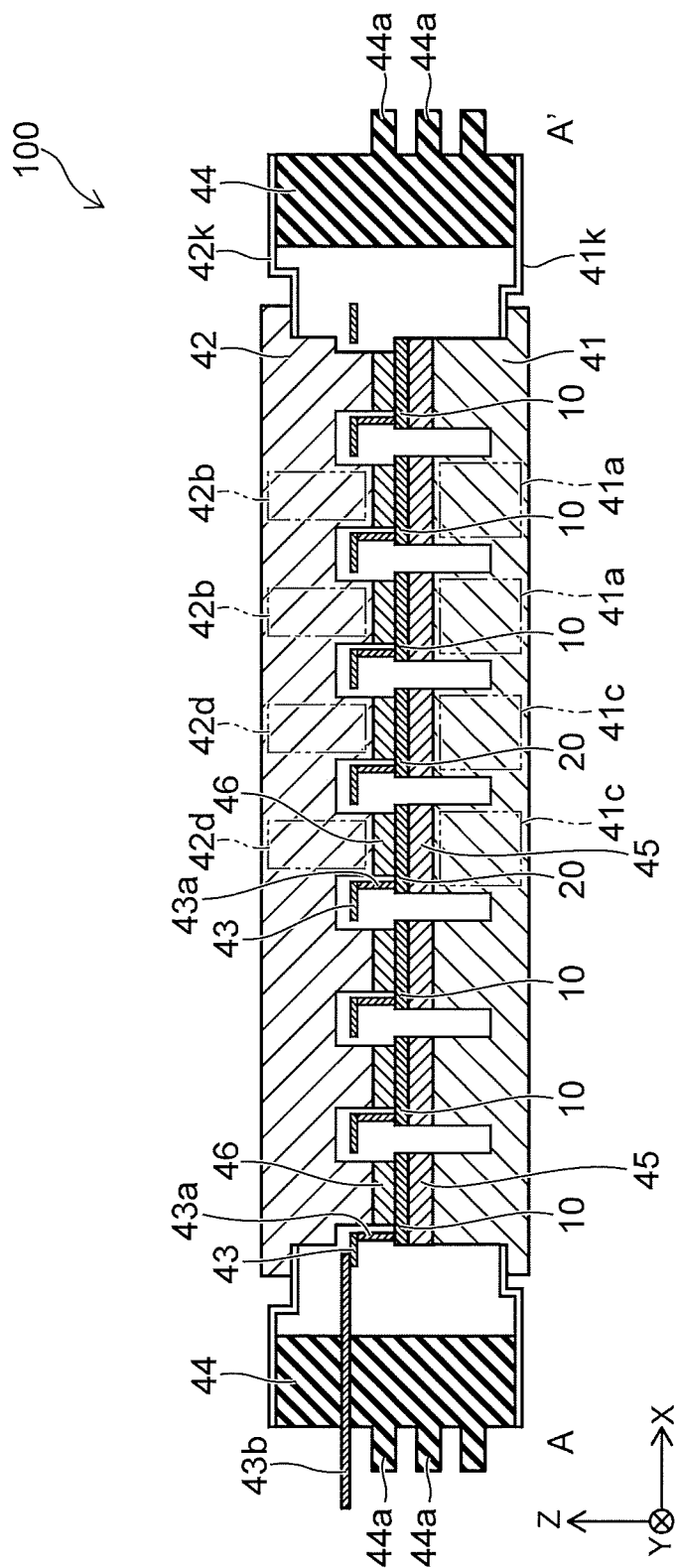
FIG. 1 is a cross-sectional view illustrating a semiconductor device according to a first embodiment.

According to an embodiment, a semiconductor device includes a first electrically conductive portion, a first semiconductor chip of a reverse-conducting insulated gate bipolar transistor, a second electrically conductive portion, a third electrically conductive portion, a second semiconductor chip of an insulated gate bipolar transistor, and a fourth electrically conductive portion. The first semiconductor chip includes a first electrode and a second electrode. The first electrode is electrically connected to the first electrically conductive portion. The second electrode is provided on a side opposite to the first electrode. The second electrically conductive portion is electrically connected to the second electrode. The third electrically conductive portion is electrically connected to the first electrically conductive portion. A potential of the third electrically conductive portion is set to be the same as a potential of the first electrically conductive portion. The second semiconductor chip includes a third electrode and a fourth electrode. The third electrode is electrically connected to the third electrically conductive portion. The fourth electrode is provided on a side opposite to the third electrode. The fourth electrically conductive portion is electrically connected to the fourth electrode and the second electrically conductive portion. A potential of the fourth electrically conductive portion is set to be the same as a potential of the second electrically conductive portion.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

In the following descriptions and drawings, notations of n+, n, n− and p+, p represent relative height of an impurity concentration in conductive types. That is, the notation with "+" shows a relatively higher impurity concentration than an impurity concentration for the notation without any of "+" and "−". The notation with "−" shows a relatively lower impurity concentration than the impurity concentration for the notation without any of them. These notations represent relative height of a net impurity concentration after mutual compensation of these impurities when respective regions include both of a p-type impurity and an n-type impurity.

The embodiments described below may be implemented by reversing the p-type and the n-type of the semiconductor regions.

First Embodiment

FIG. 1 is a cross-sectional view illustrating a semiconductor device according to a first embodiment.

The semiconductor device 100 illustrated in FIG. 1 includes a semiconductor chip 10 (a first semiconductor chip), a semiconductor chip 20 (an example of a second semiconductor chip), a first metal plate 41, a second metal plate 42, a metal plate 43, and a housing 44 (a frame).

An XYZ orthogonal coordinate system is used in the description of the embodiments recited below. In the first embodiment, the direction from the first metal plate 41 toward the second metal plate 42 is taken as a Z-direction. Two mutually-orthogonal directions perpendicular to the Z-direction are taken as an X-direction and a Y-direction. In the description, the direction from the first metal plate 41 toward the second metal plate 42 is called "up;" and the reverse direction is called "down." These directions are based on the relative positional relationship between the first metal plate 41 and the second metal plate 42 and are independent of the direction of gravity.

The first metal plate 41 and the second metal plate 42 spread along the X-direction and the Y-direction and are separated from each other in the Z-direction. The first metal plate 41 includes a first electrically conductive portion 41a and a third electrically conductive portion 41c. The upper surfaces of the first electrically conductive portion 41a and the third electrically conductive portion 41c protrude upward higher than the upper surfaces of the other portions. The semiconductor chip 10 is provided on the first electrically conductive portion 41a. The semiconductor chip 20 is provided on the third electrically conductive portion 41c.

The second metal plate 42 includes a second electrically conductive portion 42b and a fourth electrically conductive portion 42d. The lower surfaces of the second electrically conductive portion 42b and the fourth electrically conductive portion 42d protrude downward lower than the lower surfaces of the other portions. The second electrically conductive portion 42b is provided on the semiconductor chip 10. The fourth electrically conductive portion 42d is provided on the semiconductor chip 20.

A lower surface electrode and an upper surface electrode of the semiconductor chip 10 are electrically connected respectively to the first electrically conductive portion 41a and the second electrically conductive portion 42b. A lower surface electrode and an upper surface electrode of the semiconductor chip 20 are electrically connected respectively to the third electrically conductive portion 41c and the fourth electrically conductive portion 42d.

The semiconductor device 100 may include multiple thermal compensation plates 45 and multiple thermal compensation plates 46 as illustrated in FIG. 1. The multiple thermal compensation plates 45 are provided respectively between the first electrically conductive portion 41a and the semiconductor chip 10 and between the third electrically conductive portion 41c and the semiconductor chip 20. The multiple thermal compensation plates 46 are provided respectively between the semiconductor chip 10 and the second electrically conductive portion 42b and between the semiconductor chip 20 and the fourth electrically conductive portion 42d. The semiconductor chip 10 and the semiconductor chip 20 are electrically connected to the first metal plate 41 and the second metal plate 42 via the thermal compensation plates 45 and 46.

For example, the semiconductor device 100 includes multiple semiconductor chips 10 and multiple semiconductor chips 20. The first metal plate 41 includes multiple first electrically conductive portions 41a and multiple third electrically conductive portions 41c. The second metal plate 42 includes multiple second electrically conductive portions 42b and multiple fourth electrically conductive portions 42d. The multiple semiconductor chips 10 are provided respectively between the multiple first electrically conductive portions 41a and the multiple second electrically conductive portions 42b. The multiple semiconductor chips 20 are provided respectively between the multiple third electrically conductive portions 41c and the multiple fourth electrically conductive portions 42d.

The housing 44 is a member having a ring configuration and is provided around the multiple semiconductor chips 10 and the multiple semiconductor chips 20. The housing 44 includes an insulating ceramic such as alumina, etc. Multiple protrusions 44a are provided at the outer perimeter of the housing 44. The insulative property (the creepage distance) between the first metal plate 41 and the second metal plate 42 can be improved by providing the protrusions 44a.

The first metal plate 41 and the second metal plate 42 respectively include a fringe 41k and a fringe 42k. The fringe 41k and the fringe 42k are fixed by brazing respectively at the outer perimeter of the first metal plate 41 and the outer perimeter of the second metal plate 42. The housing 44 is interposed between the fringe 41k of the first metal plate 41 and the fringe 42k of the second metal plate 42 and is fixed by brazing to these fringes.

The semiconductor chip 10 and the semiconductor chip 20 further include other upper surface electrodes. These upper surface electrodes are electrically connected to the metal plate 43 via pins 43a. The metal plate 43 is a member having a flat plate configuration spreading along the X-direction and the Y-direction. The metal plate 43 is provided inside the housing 44. The metal plate 43 is electrically connected to a terminal 43b drawn outside the housing 44.

The multiple semiconductor chips 10 and the multiple semiconductor chips 20 are surrounded and sealed with the first metal plate 41, the second metal plate 42, and the housing 44. For example, an inert gas is filled into the surrounded space.

By pressing the first metal plate 41 and the second metal plate 42 in directions approaching each other, the semiconductor chips 10 and the semiconductor chips 20 are closely adhered to the first metal plate 41 and the second metal plate 42; and good electrical contact is obtained.

The first metal plate 41 and the second metal plate 42 include a metal having high electrical conductivity and thermal conductivity such as copper, etc. Materials that have thermal expansion coefficients near those of the semiconductor chip 10 and the semiconductor chip 20 are used in the thermal compensation plates 45 and 46. For example, in the case where the semiconductor chip 10 and the semiconductor chip 20 include silicon, the thermal compensation plates 45 and 46 include molybdenum. The fringe 41k and the fringe 42k include, for example, an iron-nickel alloy.

Figure 2:
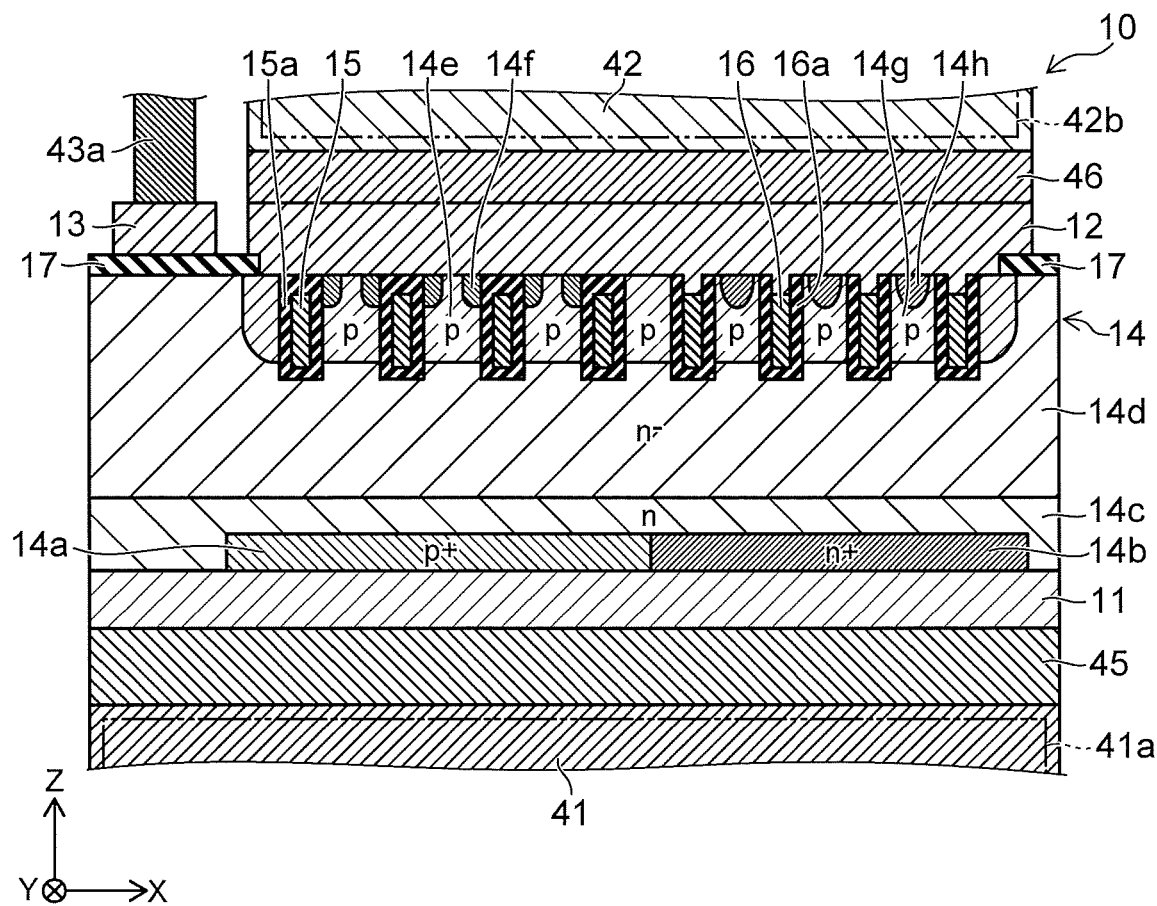
FIG. 2 is a cross-sectional view illustrating an example of a semiconductor chip of the semiconductor device according to the first embodiment.

FIG. 2 is a cross-sectional view illustrating an example of the semiconductor chip 10 of the semiconductor device according to the first embodiment.

The semiconductor chip 10 is an RC-IGBT. As illustrated in FIG. 2, the semiconductor chip 10 includes a collector electrode 11, an emitter electrode 12, a gate pad 13, a semiconductor portion 14, a gate electrode 15, and an electrically conductive portion 16.

The collector electrode 11 is provided at the lower surface of the semiconductor chip 10 and is electrically connected to the first electrically conductive portion 41a via the thermal compensation plate 45. The emitter electrode 12 is provided at the upper surface of the semiconductor chip 10 and is electrically connected to the second electrically conductive portion 42b via the thermal compensation plate 46. The gate pad 13 is provided at the upper surface of the semiconductor chip 10 and is electrically connected to the metal plate 43 via the pin 43a.

The semiconductor portion 14 is provided between the collector electrode 11 and the emitter electrode 12 and between the collector electrode 11 and the gate pad 13. The semiconductor portion 14 includes, for example, a $p^+$-type collector region 14a, an $n^+$-type cathode region 14b, an n-type buffer region 14c, an $n^-$-type drift region 14d, a p-type base region 14e, an $n^+$-type emitter region 14f, a p-type anode region 14g, and a $p^+$-type anode region 14h.

The $p^+$-type collector region 14a and the $n^+$-type cathode region 14b are provided on the collector electrode 11 and are electrically connected to the collector electrode 11. The n-type buffer region 14c is provided on the $p^+$-type collector region 14a and the $n^+$-type cathode region 14b and around the $p^+$-type collector region 14a and the $n^+$-type cathode region 14b.

The $n^-$-type drift region 14d is provided on the n-type buffer region 14c. The p-type base region 14e is provided on the $n^-$-type drift region 14d and is positioned on the $p^+$-type collector region 14a. The p-type anode region 14g is provided on the $n^-$-type drift region 14d and is positioned on the $n^+$-type cathode region 14b. The $n^+$-type emitter region 14f is provided selectively on the p-type base region 14e. The $p^+$-type anode region 14h is provided selectively on the p-type anode region 14g.

For example, the gate electrode 15 and the electrically conductive portion 16 are provided inside the semiconductor portion 14. The gate electrode 15 opposes the p-type base region 14e with a gate insulating layer 15a interposed. The electrically conductive portion 16 opposes the p-type anode region 14g with an insulating layer 16a interposed.

The emitter electrode 12 is electrically connected to the p-type base region 14e, the $n^+$-type emitter region 14f, the p-type anode region 14g, the $p^+$-type anode region 14h, and the electrically conductive portion 16. The gate pad 13 is electrically connected to the gate electrode 15. The surface of the semiconductor portion 14 around the p-type base region 14e and the p-type anode region 14g is covered with an insulating layer 17. The gate pad 13 is provided on the semiconductor portion 14 with the insulating layer 17 interposed.

The region of the semiconductor chip 10 where the $p^+$-type collector region 14a, the p-type base region 14e, the $n^+$-type emitter region 14f, and the gate electrode 15 are provided functions as an IGBT. The region where the $n^+$-type cathode region 14b, the p-type anode region 14g, and the $p^+$-type anode region 14h are provided functions as a diode.

Figure 3:
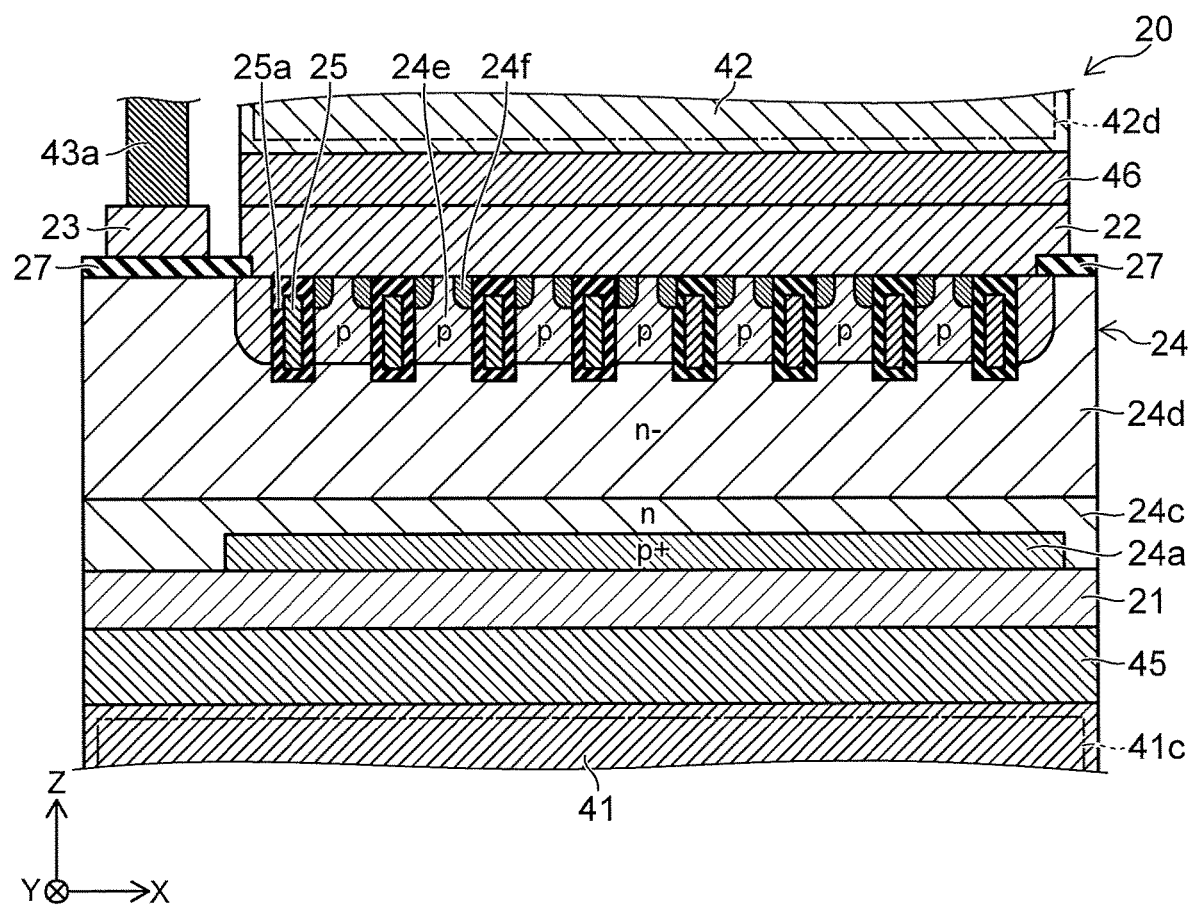
FIG. 3 is a cross-sectional view illustrating an example of a semiconductor chip of the semiconductor device according to the first embodiment.

FIG. 3 is a cross-sectional view illustrating an example of the semiconductor chip 20 of the semiconductor device according to the first embodiment.

The semiconductor chip 20 is an IGBT. As illustrated in FIG. 3, the semiconductor chip 20 includes a collector electrode 21 (an example of a third electrode), an emitter electrode 22 (an example of a fourth electrode), a gate pad 23, a semiconductor portion 24, and a gate electrode 25.

The collector electrode 21 is provided at the lower surface of the semiconductor chip 20 and is electrically connected to the third electrically conductive portion 41c via the thermal compensation plate 45. The emitter electrode 22 is provided at the upper surface of the semiconductor chip 20 and is electrically connected to the fourth electrically conductive portion 42d via the thermal compensation plate 46. The gate pad 23 is provided at the upper surface of the semiconductor chip 20 and is electrically connected to the metal plate 43 via the pin 43a.

The semiconductor portion 24 is provided respectively between the collector electrode 21 and the emitter electrode 22 and between the collector electrode 21 and the gate pad 23. The semiconductor portion 24 includes, for example, a $p^+$-type collector region 24a, an n-type buffer region 24c, an $n^-$-type drift region 24d, a p-type base region 24e, and an $n^+$-type emitter region 24f.

The $p^+$-type collector region 24a is provided on the collector electrode 21 and is electrically connected to the collector electrode 21. The n-type buffer region 24c is provided on the $p^+$-type collector region 24a and around the $p^+$-type collector region 24a. The $n^-$-type drift region 24d is provided on the n-type buffer region 24c. The p-type base region 24e is provided on the $n^-$-type drift region 24d. The $n^+$-type emitter region 24f is provided selectively on the p-type base region 24e. For example, the gate electrode 25 is provided inside the semiconductor portion 24. The gate electrode 25 opposes the p-type base region 24e with a gate insulating layer 25a interposed.

The emitter electrode 22 is electrically connected to the p-type base region 24e and the $n^+$-type emitter region 24f. The gate pad 23 is electrically connected to the gate electrode 25. The surface of the semiconductor portion 24 around the p-type base region 24e is covered with an insulating layer 27. The gate pad 23 is provided on the semiconductor portion 24 with the insulating layer 27 interposed.

Material examples of the components of the semiconductor chip 10 and the semiconductor chip 20 will now be described.

The collector electrode 11, the collector electrode 21, the emitter electrode 12, the emitter electrode 22, the gate pad 13, and the gate pad 23 include a metal such as aluminum, nickel, copper, etc.

The semiconductor portion 14 and the semiconductor portion 24 include silicon, silicon carbide, gallium nitride, or gallium arsenide as a semiconductor material. In the case where silicon is used as the semiconductor material, arsenic, phosphorus, or antimony is used as an n-type impurity. Boron is used as a p-type impurity.

The gate electrode 15, the gate electrode 25, and the electrically conductive portion 16 include an electrically conductive material such as polysilicon, etc. The gate insulating layer 15a, the gate insulating layer 25a, the insulating layer 16a, the insulating layer 17, and the insulating layer 27 include an insulating material such as silicon oxide, etc.

Operations of the semiconductor device 100 will now be described.

When a voltage that is a threshold or more is applied to the gate electrode 15 via the metal plate 43, a channel is formed at the gate insulating layer 15a vicinity of the p-type base region 14e. For example, a voltage that is positive with respect to the second metal plate 42 is applied to the first metal plate 41. In other words, a voltage that is positive with respect to the emitter electrode 12 is applied to the collector electrode 11. When the channel is formed in this state, electrons flow through the channel from the emitter electrode 12 to the n⁻-type drift region 14d and are ejected from the collector electrode 11. Holes flow through the p⁺-type collector region 14a from the collector electrode 11 to the n⁻-type drift region 14d and are ejected from the emitter electrode 12. A current flows in the semiconductor chip 10; and the semiconductor chip 10 is set to the ON-state.

This is similar for the semiconductor chip 20 as well. A voltage that is the threshold or more is applied to the gate electrode 25 via the metal plate 43 in a state in which a voltage that is positive with respect to the emitter electrode 22 is applied to the collector electrode 21. A current flows in the semiconductor chip 20; and the semiconductor chip 20 is set to the ON-state.

When the semiconductor chip 10 and the semiconductor chip 20 are in the ON-state, conductivity modulation occurs in the n⁻-type drift region 14d and the n⁻-type drift region 24d due to the injected electrons and holes; and the electrical resistance greatly decreases.

By switching the semiconductor chip 10 and the semiconductor chip 20 to the ON-state in the state in which the voltage that is positive with respect to the second metal plate 42 is applied to the first metal plate 41, a current flows from the first metal plate 41 toward the second metal plate 42.

For example, a bridge circuit is configured using the multiple semiconductor devices 100. In the bridge circuit, when one semiconductor device 100 is switched from the ON-state to the OFF-state, an induced electromotive force is applied to the second metal plate 42 of another semiconductor device 100. The semiconductor chip 10 includes a diode. When the induced electromotive force is applied to the emitter electrode 12 via the second metal plate 42, holes flow from the emitter electrode 12 to the n⁻-type drift region 14d through the p-type anode region 14g and the p⁺-type anode region 14h and are ejected from the collector electrode 11. Electrons flow from the collector electrode 11 to the n⁻-type drift region 14d through the n⁺-type cathode region 14b and are ejected from the emitter electrode 12. In other words, a freewheeling current flows in the forward direction of the diode of the semiconductor chip 10. At this time, conductivity modulation occurs in the n⁻-type drift region 14d due to the injected electrons and holes; and the electrical resistance greatly decreases.

Figure 4:
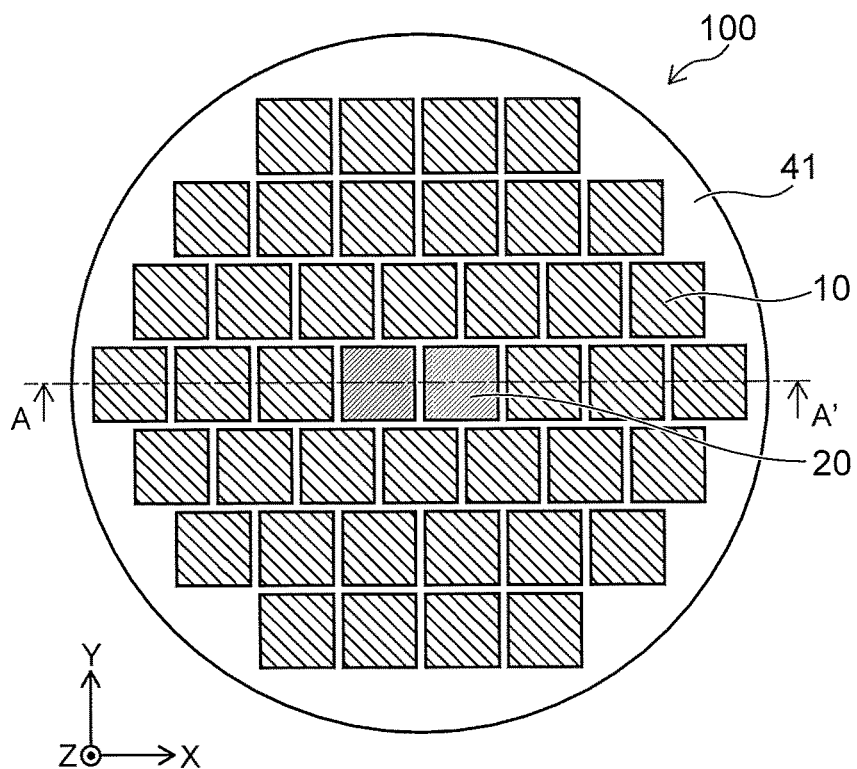
FIG. 4 is a plan view illustrating an arrangement of the semiconductor chips of the semiconductor device according to the first embodiment.

FIG. 4 is a plan view illustrating an arrangement of the semiconductor chips of the semiconductor device according to the first embodiment. FIG. 1 is an A-A' cross-sectional view of FIG. 4.

In FIG. 4, the semiconductor chips 10 and the semiconductor chips 20 are marked with mutually-different hatching. As illustrated in FIG. 4, for example, the number of the semiconductor chips 20 is less than the number of the semiconductor chips 10. The semiconductor chips 20 are provided at positions surrounded with the multiple semiconductor chips 10. The multiple semiconductor chips 20 are provided to be adjacent to each other.

The semiconductor chips 10 include both IGBT regions and FRD regions. The semiconductor chips 20 include only IGBT regions. In other words, when the semiconductor device 100 is in the ON-state, the regions where the current flows in the semiconductor chips 10 are narrower than the regions where the current flows in the semiconductor chips 20. Therefore, compared to the semiconductor chips 20, the current density is higher and the heat generation is larger in the semiconductor chips 10. Accordingly, to suppress the temperature increase of the semiconductor device 100 due to heat generation when operating, it is desirable for the semiconductor chips 10 to be provided further on the outer perimeter side of the semiconductor device 100 than the semiconductor chips 20 so that the heat of the semiconductor chips 10 is released more efficiently to the outside.

Effects of the first embodiment will now be described with reference to a semiconductor device according to a reference example.

Figure 5:
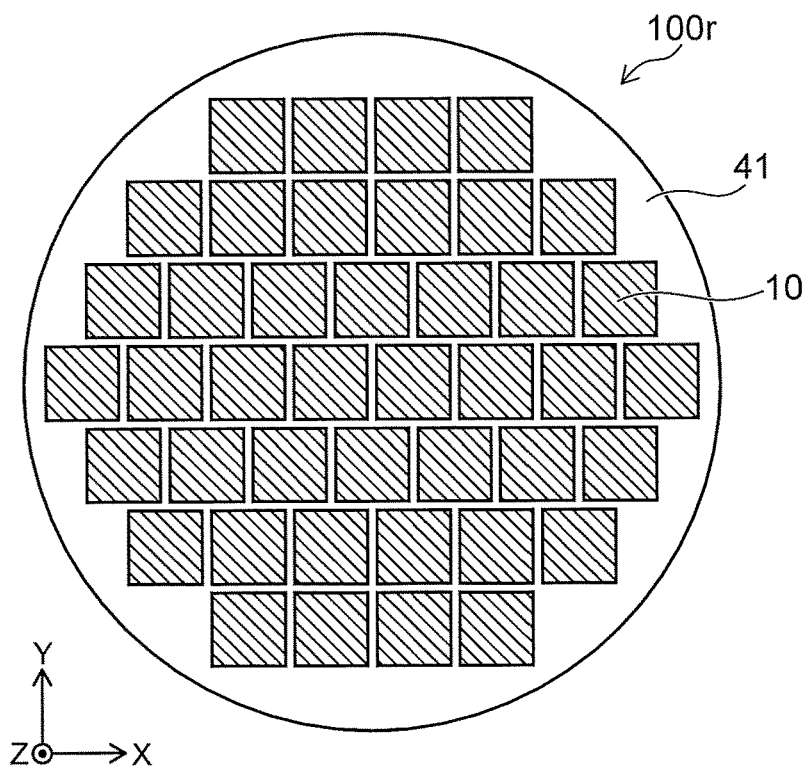
FIG. 5 is a plan view illustrating a semiconductor device according to a reference example.

FIG. 5 is a plan view illustrating the semiconductor device according to the reference example.

Figure 6:
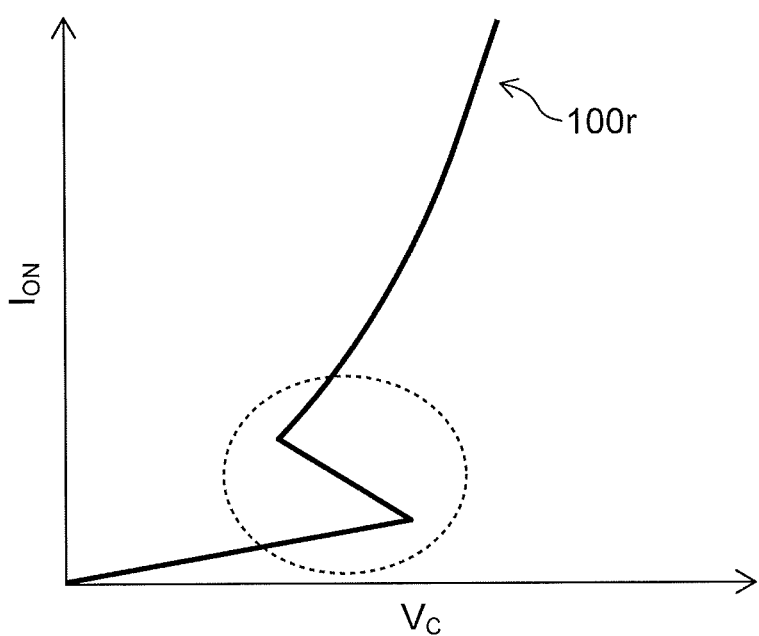
FIG. 6 is a graph illustrating a characteristic of the semiconductor device according to the reference example.

FIG. 6 is a graph illustrating a characteristic of the semiconductor device according to the reference example.

Figure 7A:
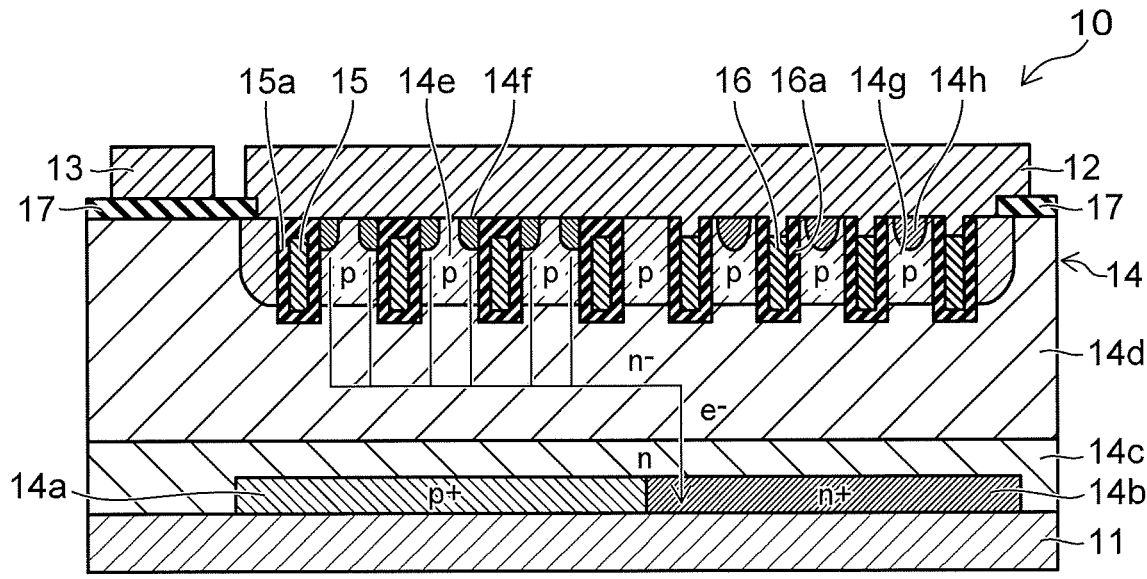
FIGS. 7A and 7B are cross-sectional views illustrating operations of the semiconductor device according to the reference example.
Figure 7B:
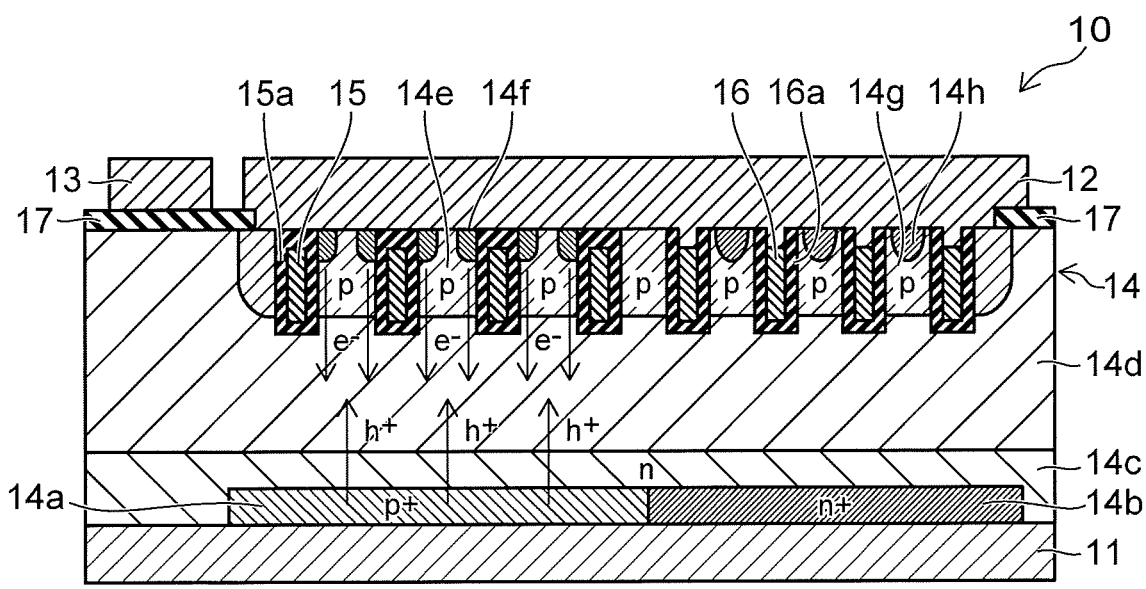

FIGS. 7A and 7B are cross-sectional views illustrating operations of the semiconductor device according to the reference example.

In the semiconductor device 100r according to the reference example illustrated in FIG. 5, only the semiconductor chips 10 are provided; and the semiconductor chips 20 are not provided. In FIG. 6, the horizontal axis is a voltage $V_C$ with respect to the emitter electrode 12 applied to the collector electrode 11. The vertical axis is a current $I_{ON}$ flowing from the collector electrode 11 toward the emitter electrode 12 in the ON-state. In the case of the semiconductor device 100r according to the reference example, when the voltage $V_C$ increases to some magnitude, the voltage $V_C$ abruptly decreases as the current $I_{ON}$ increases as in the portion surrounded with the dotted line of FIG. 6. This phenomenon is called snapback.

The snapback illustrated in FIG. 6 occurs because the semiconductor chips 10 are RC-IGBTs. When the semiconductor chip 10 is in the ON-state and when a voltage having a sufficient magnitude is applied to the collector electrode 11, the holes and the electrons are injected into the n⁻-type drift region 14d from the collector electrode 11 and the emitter electrode 12 as described above. Thereby, conductivity modulation occurs in the n⁻-type drift region 14d; and the electrical resistance of the semiconductor device 100r decreases greatly.

When the voltage that is applied to the collector electrode 11 in the ON-state is low, the potential difference between the p⁺-type collector region 14a and the n-type buffer region 14c does not reach or exceed the built-in potential; and the holes are not injected into the n⁻-type drift region 14d from the p⁺-type collector region 14a. As a result, only the electrons from the emitter electrode 12 are injected. The electrons are ejected to the collector electrode 11 through the n⁻-type drift region 14d and the n⁺-type cathode region 14b as illustrated by the arrows of FIG. 7A. In other words, an operation of MOS mode occurs instead of an IGBT operation in the semiconductor chip 10.

Subsequently, when the voltage that is applied to the collector electrode 11 increases, the potential difference between the p⁺-type collector region 14a and the n-type buffer region 14c reaches or exceeds the built-in potential. As illustrated in FIG. 7B, the holes are injected into the n⁻-type drift region 14d from the p⁺-type collector region 14a; and the electrical resistance of the semiconductor device 100r decreases. The current $I_{ON}$ increases; the voltage $V_C$ decreases; and snapback such as that illustrated in FIG. 6 occurs.

By using the RC-IGBT semiconductor chip 10, it is unnecessary to separately provide the semiconductor chip of the IGBT and the semiconductor chip of the diode when configuring the semiconductor device. Therefore, the semiconductor device can be downsized. On the other hand, in the case where the semiconductor chip 10 is used, the operation of MOS mode illustrated in FIG. 7A may occur. The power consumption of this operation is large compared to that of the operation of the IGBT illustrated in FIG. 7B. In the case where the operation of MOS mode occurs, the power consumption of the semiconductor device increases.

The semiconductor device 100 according to the first embodiment includes the semiconductor chip 20 in addition to the semiconductor chip 10. The semiconductor chip 20 is an IGBT. As illustrated in FIG. 3, at the lower surface of the semiconductor portion 24 of the semiconductor chip 20, the p$^+$-type collector region 24a is provided; and an n$^+$-type semiconductor region is not provided. In the semiconductor chip 20, a path where the electrons flow such as that of the semiconductor chip 10 illustrated in FIG. 7A does not exist. An operation of MOS mode in the semiconductor chip 20 is suppressed.

In the case where the electrons do not flow from the emitter electrode 22 to the collector electrode 21, the potential difference between the collector electrode 21 and the emitter electrode 22 increases by that amount. Thereby, the potential difference between the p$^+$-type collector region 24a and the n$^-$-type drift region 24d decreases. As a result, in the semiconductor chip 20, the holes are injected into the n$^-$-type drift region 24d from the p$^+$-type collector region 24a also in the state in which the voltage applied to the collector electrode 21 is low; and an IGBT operation occurs. The current flows mainly in the semiconductor chip 20 having the low electrical resistance; and the operation of MOS mode of the semiconductor chip 10 is suppressed. Subsequently, when the voltage $V_C$ increases, an IGBT operation occurs in the semiconductor chip 10 as well. According to the semiconductor device 100 according to the embodiment, the occurrence of an operation of MOS mode such as that of the semiconductor device 100r according to the reference example in the ON-state can be suppressed.

Figure 8A:
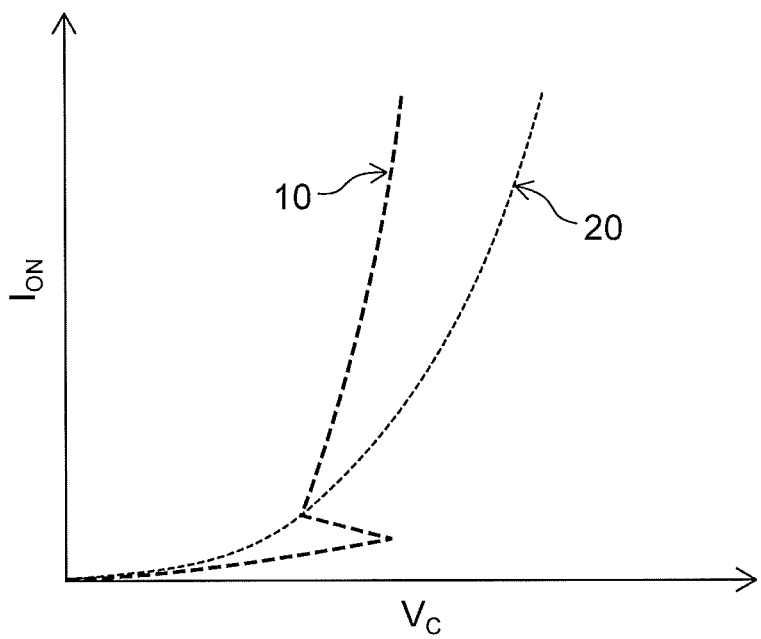
FIG. 8A and FIG. 8B are graphs illustrating characteristics of the semiconductor device according to the first embodiment.
Figure 8B:
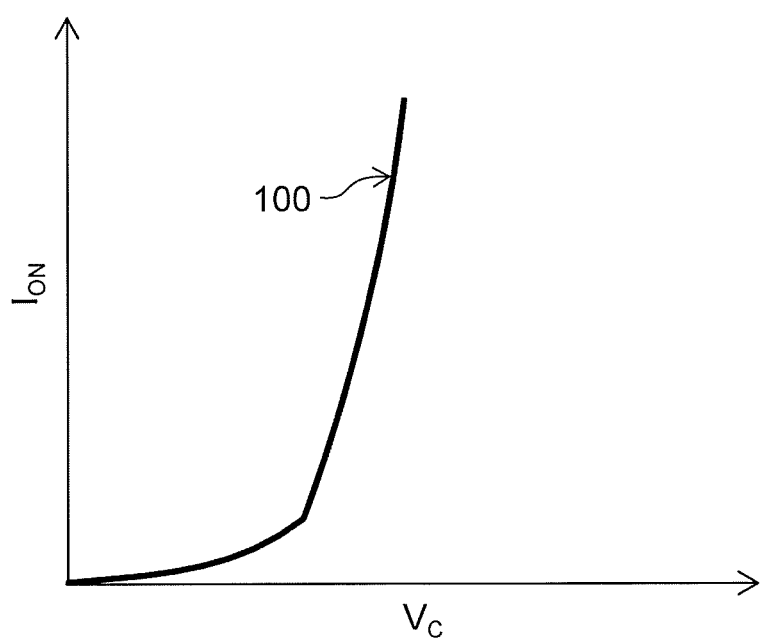

FIG. 8A and FIG. 8B are graphs illustrating characteristics of the semiconductor device according to the first embodiment.

In FIG. 8A and FIG. 8B, the horizontal axis is the voltage $V_C$; and the vertical axis is the current $I_{ON}$. FIG. 8A illustrates the characteristics of the semiconductor chip 10 and the semiconductor chip 20. FIG. 8B illustrates the characteristic of the entire semiconductor device 100.

As illustrated in FIG. 8A and FIG. 8B, the characteristic of the semiconductor device 100 is substantially the combination of the portions of the characteristics of the semiconductor chip 10 and the semiconductor chip 20, the portions having lower resistances. According to the first embodiment as illustrated in FIG. 8B, the occurrence of the operation of MOS mode and the snapback of the semiconductor device 100 is suppressed. Thereby, the power consumption of the semiconductor device 100 can be reduced.

Figure 9A:
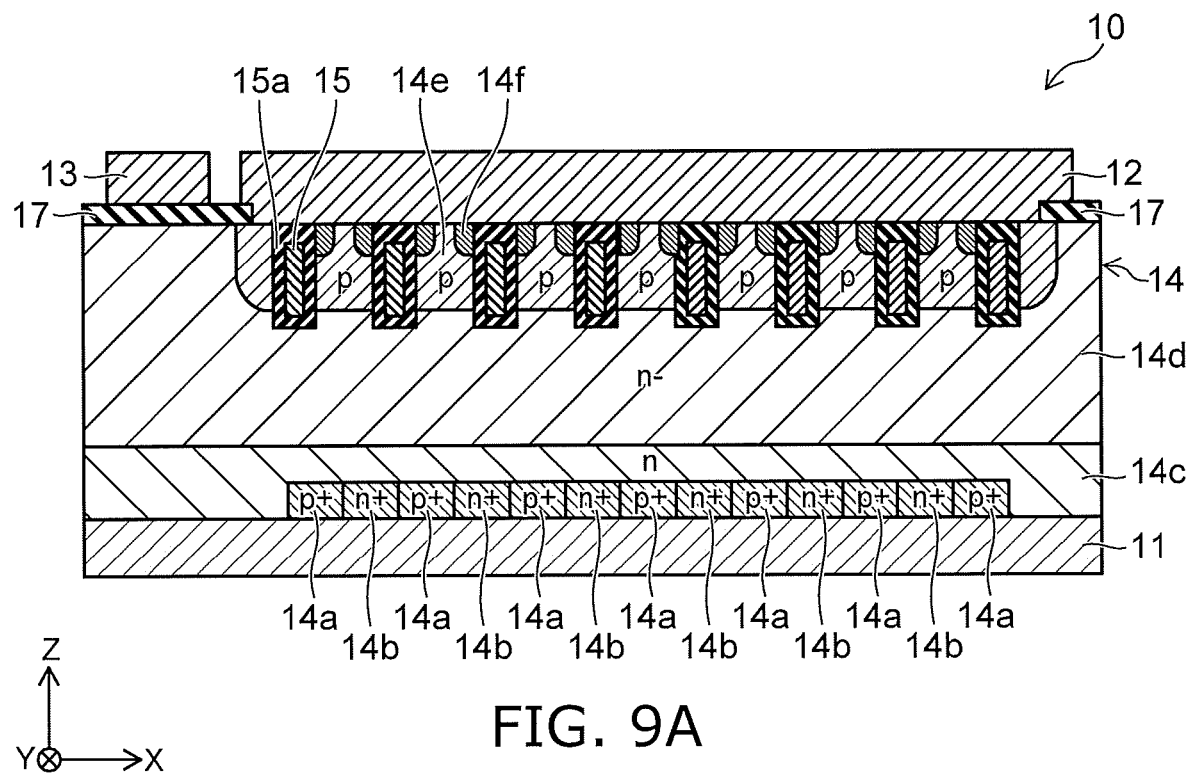
FIG. 9A, FIG. 9B, and FIG. 10 are cross-sectional views illustrating other examples of the semiconductor chip of the semiconductor device according to the first embodiment.
Figure 9B:
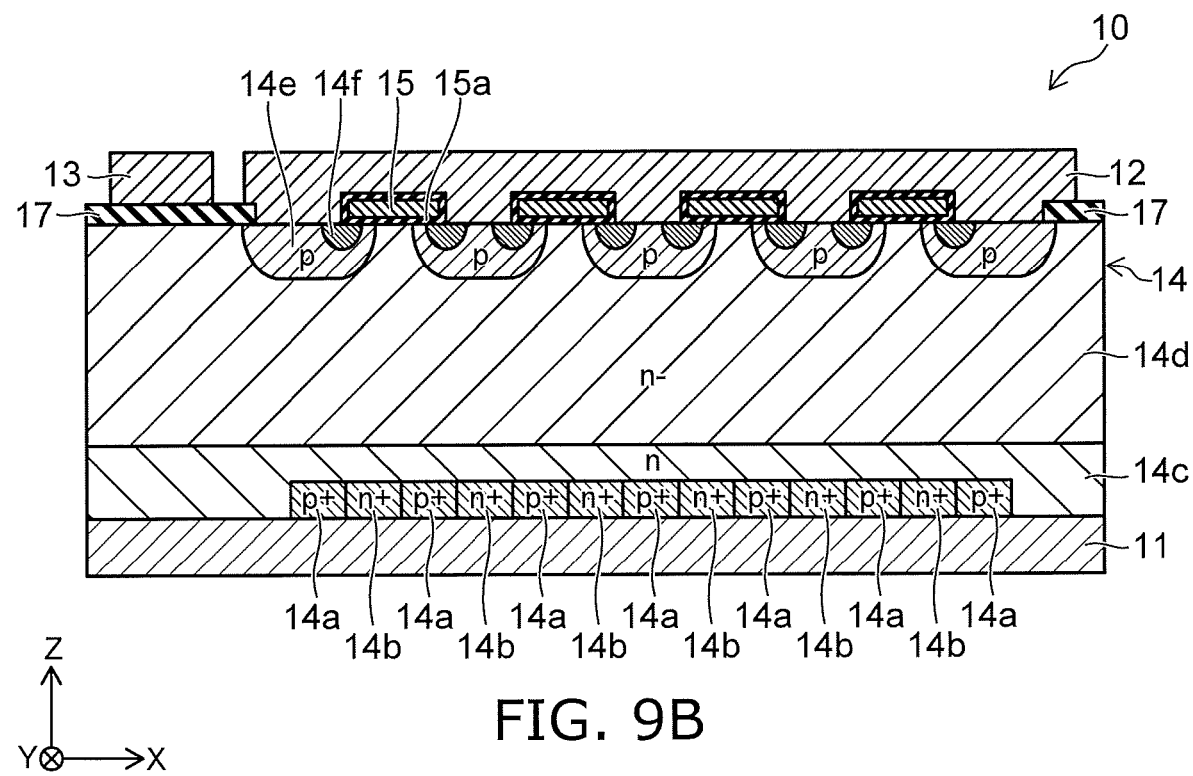
Figure 10:
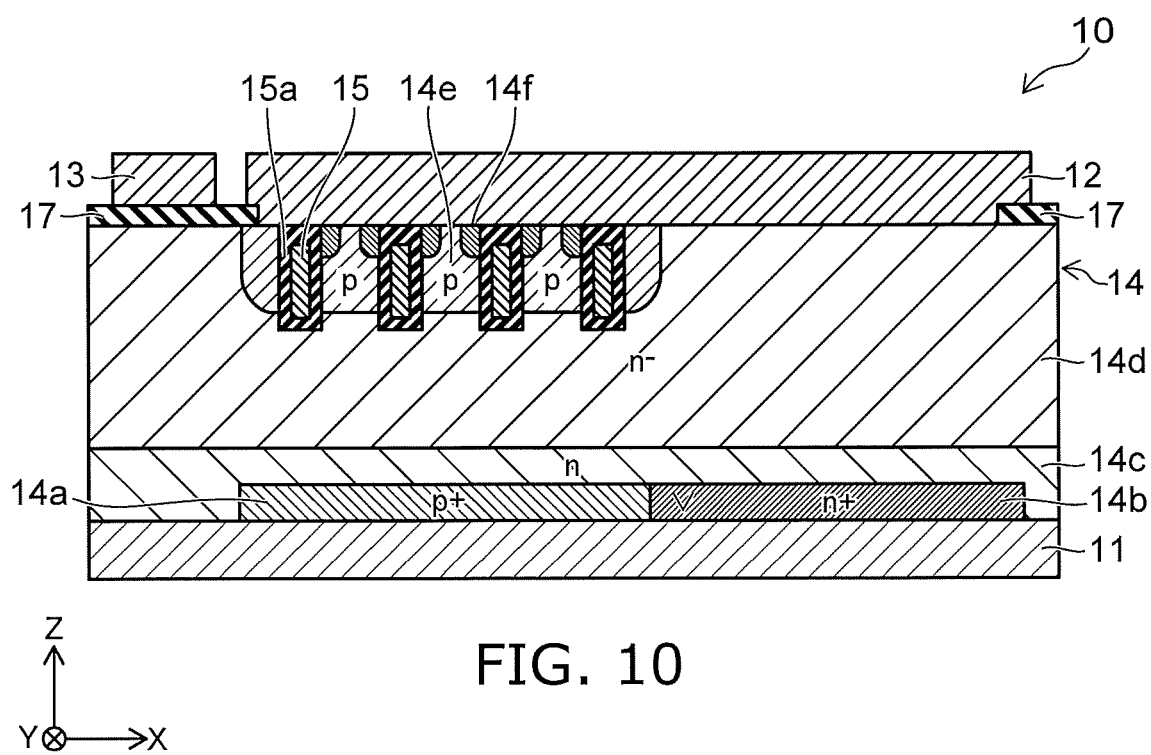

FIG. 9A, FIG. 9B, and FIG. 10 are cross-sectional views illustrating other examples of the semiconductor chip 10 of the semiconductor device according to the first embodiment.

The specific configuration of the semiconductor chip 10 is modifiable as appropriate as long as the semiconductor chip 10 can operate as an RC-IGBT.

For example, as illustrated in FIG. 9A, the multiple p$^+$-type collector regions 14a and the multiple n$^+$-type cathode regions 14b may be provided alternately in the X-direction or the Y-direction on the collector electrode 11. The p-type anode region 14g, the p$^+$-type anode region 14h, and the electrically conductive portion 16 may not be provided on the upper surface side of the semiconductor portion 14. In the case where a voltage that is positive with respect to the collector electrode 11 is applied to the emitter electrode 12, the current flows from the emitter electrode 12 to the collector electrode 11 through a body diode made of the n$^-$-type drift region 14d and the p-type base region 14e.

As illustrated in FIG. 9B, the gate electrode 15 may be provided on the semiconductor portion 14 with the gate insulating layer 15a interposed. The gate electrode 15 opposes the n$^-$-type drift region 14d, the p-type base region 14e, and the n$^+$-type emitter region 14f with the gate insulating layer 15a interposed in the Z-direction.

Similarly for the semiconductor chip 20 as well, the specific configuration is modifiable as appropriate as long as the semiconductor chip 20 can operate as an IGBT. For example, similarly to the example of FIG. 9B, the gate electrode 25 may be provided on the semiconductor portion 24 with the gate insulating layer 25a interposed.

The semiconductor chip 10 may include a Schottky barrier diode instead of the p-n junction diode. For example, as illustrated in FIG. 10, a Schottky contact may be provided between the emitter electrode 12 and a portion of the n$^-$-type drift region 14d. The Schottky contact is positioned above the n$^+$-type cathode region 14b. In such a case, the emitter electrode 12 includes, for example, a metal having a large work function such as Al, AlSi, etc.

Figure 11A:
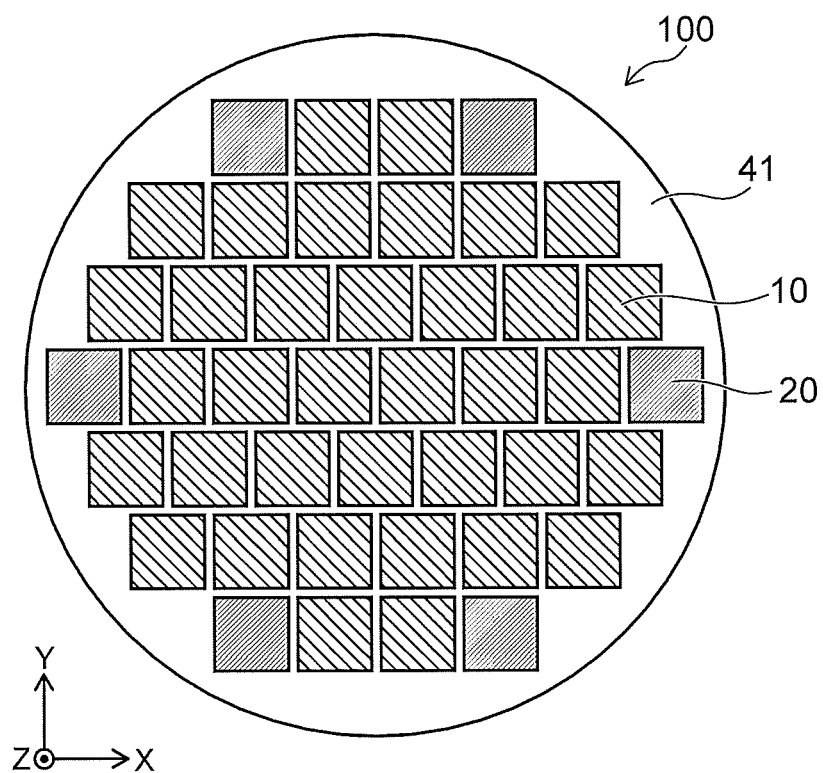
FIG. 11A to FIG. 12 are plan views illustrating arrangements of the semiconductor chips of the semiconductor device according to the first embodiment.
Figure 11B:
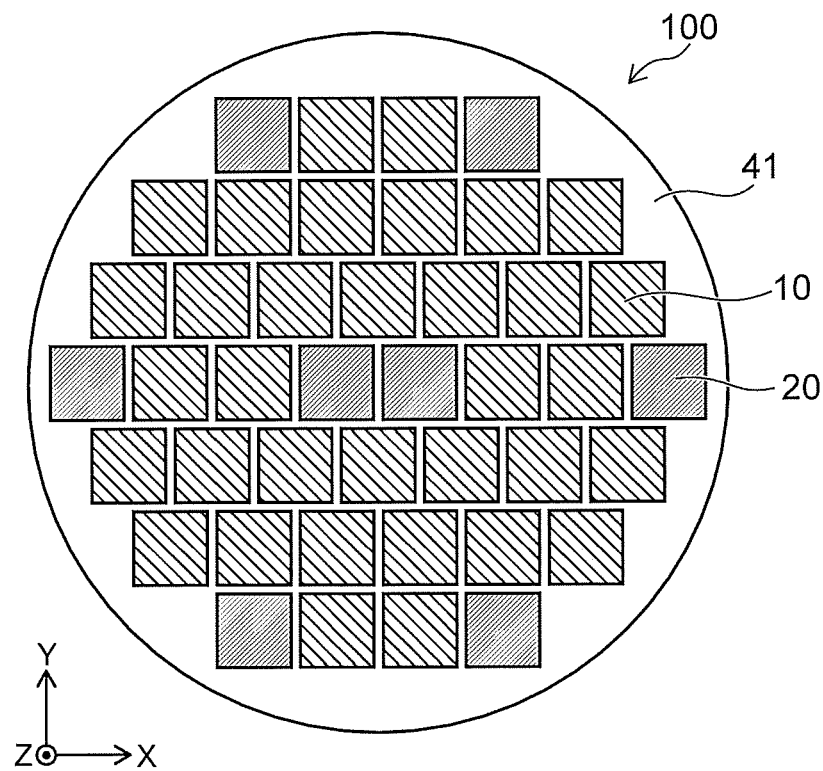
Figure 12:
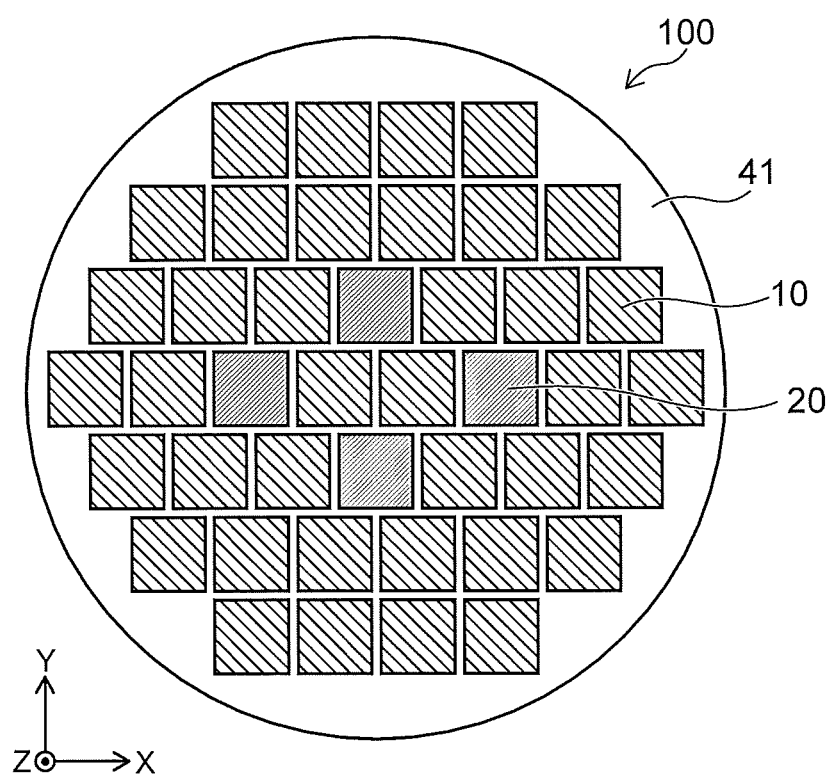

FIG. 11A to FIG. 12 are plan views illustrating arrangements of the semiconductor chips of the semiconductor device according to the first embodiment.

FIG. 11A to FIG. 12 illustrate arrangement examples of the semiconductor chips that are different from FIG. 4. As illustrated in FIG. 11A, the multiple semiconductor chips 20 may be provided to be separated from each other at the outer perimeter of the semiconductor device 100. As illustrated in FIG. 11B, the semiconductor chips 20 may be provided at both the center and the outer perimeter of the semiconductor device 100. Or, as illustrated in FIG. 12, the multiple semiconductor chips 20 may be provided to be separated from each other at middle portions between the center and the outer perimeter of the semiconductor device 100. In these arrangements as well, the occurrence of the operation of MOS mode and the snapback of the semiconductor device 100 is suppressed; and it is possible to reduce the power consumption of the semiconductor device 100.

Second Embodiment

Figure 13:
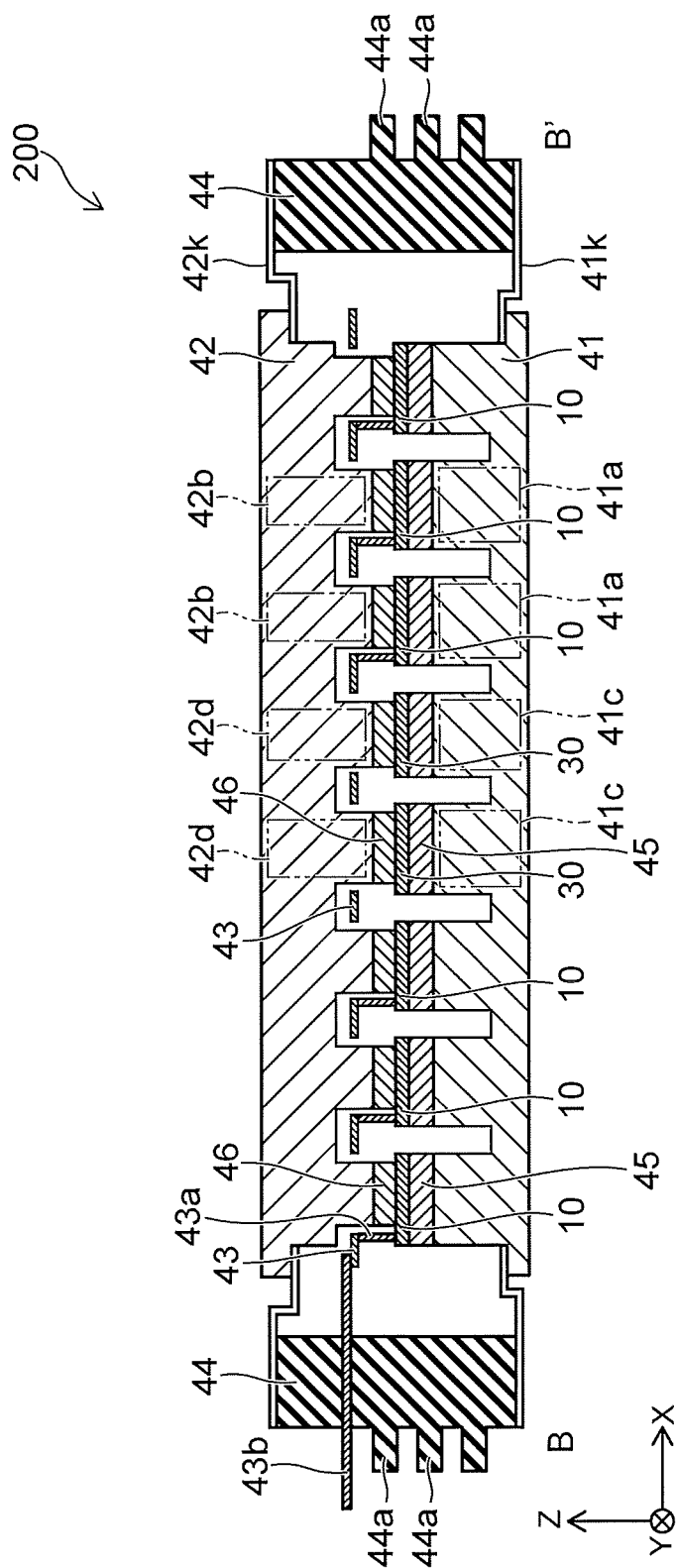
FIG. 13 is a cross-sectional view illustrating a semiconductor device according to a second embodiment.

FIG. 13 is a cross-sectional view illustrating a semiconductor device according to a second embodiment.

As illustrated in FIG. 13, instead of the semiconductor chip 20, the semiconductor device 200 according to the second embodiment includes a semiconductor chip 30 (another example of the second semiconductor chip). The semiconductor chip 30 is provided between the third electrically conductive portion 41c and the fourth electrically conductive portion 42d and is electrically connected to the third electrically conductive portion 41c and the fourth electrically conductive portion 42d.

Figure 14:
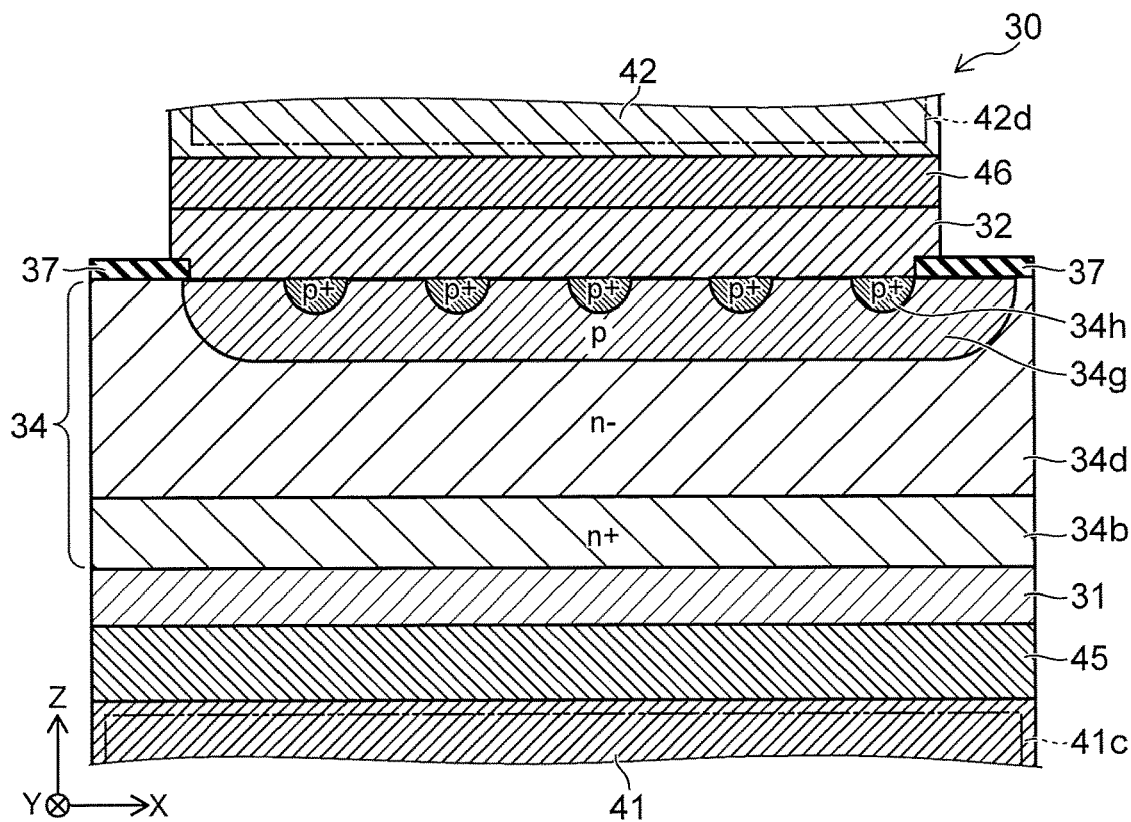
FIG. 14 is a cross-sectional view illustrating an example of a semiconductor chip of the semiconductor device according to the second embodiment.

FIG. 14 is a cross-sectional view illustrating an example of the semiconductor chip of the semiconductor device according to the second embodiment.

The semiconductor chip 30 is a diode. For example, as illustrated in FIG. 14, the semiconductor chip 30 includes a cathode electrode 31 (another example of the third electrode), an anode electrode 32 (another example of the fourth electrode), and a semiconductor portion 34.

The cathode electrode 31 is provided at the lower surface of the semiconductor chip 30 and is electrically connected to the third electrically conductive portion 41c via the thermal compensation plate 45. The anode electrode 32 is provided at the upper surface of the semiconductor chip 30 and is electrically connected to the fourth electrically conductive portion 42d via the thermal compensation plate 46. In other words, the semiconductor chip 30 is connected in antiparallel with the semiconductor chip 10.

The semiconductor chip 30 does not include a gate electrode or a gate pad. Therefore, the semiconductor chip 30 is not connected to the metal plate 43.

The semiconductor portion 34 is provided between the cathode electrode 31 and the anode electrode 32. The semiconductor portion 34 includes, for example, an $n^+$-type cathode region 34b, an $n^-$-type drift region 34d, a p-type anode region 34g, and a $p^+$-type anode region 34h.

The $n^+$-type cathode region 34b is provided on the cathode electrode 31 and is electrically connected to the cathode electrode 31. The $n^-$-type drift region 34d is provided on the $n^+$-type cathode region 34b. The p-type anode region 34g is provided on the $n^-$-type drift region 34d. The $p^+$-type anode region 34h is provided selectively on the p-type anode region 34g. The anode electrode 32 is electrically connected to the p-type anode region 34g and the $p^+$-type anode region 34h. The surface of the semiconductor portion 34 around the p-type anode region 34g is covered with an insulating layer 37.

The cathode electrode 31 and the anode electrode 32 include a metal such as aluminum, nickel, copper, etc. The semiconductor portion 34 includes silicon, silicon carbide, gallium nitride, or gallium arsenide as a semiconductor material. The insulating layer 37 includes an insulating material such as silicon oxide, etc.

Figure 15:
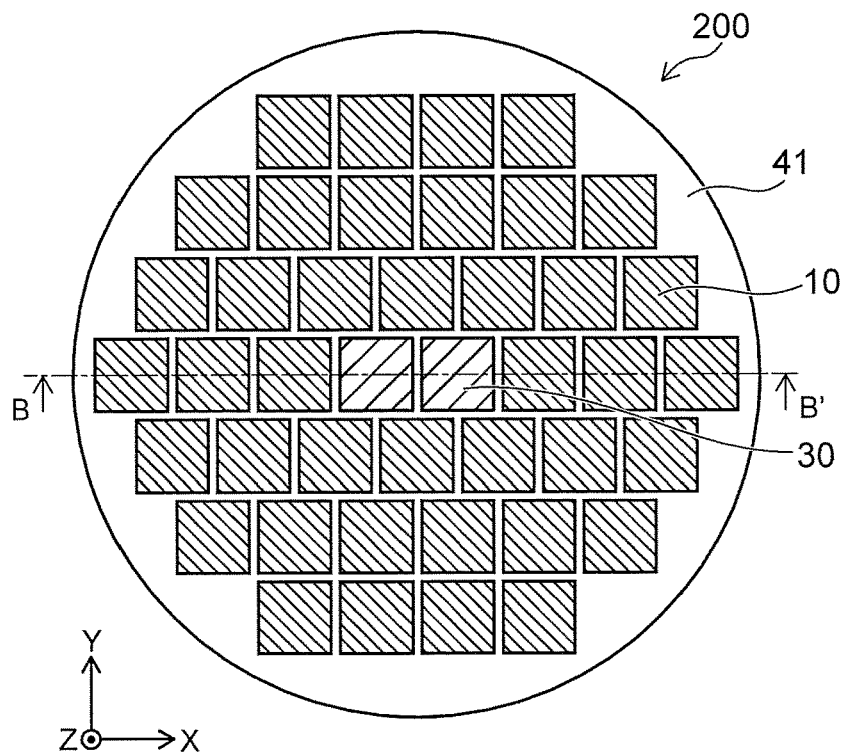
FIG. 15 is a plan view illustrating an arrangement of the semiconductor chips of the semiconductor device according to the second embodiment.

FIG. 15 is a plan view illustrating an arrangement of the semiconductor chips of the semiconductor device according to the second embodiment. FIG. 13 is a B-B' cross-sectional view of FIG. 15.

In FIG. 15, the semiconductor chips 10 and the semiconductor chips 30 are marked with mutually-different hatching. As illustrated in FIG. 15, for example, the number of the semiconductor chips 30 is less than the number of the semiconductor chips 10. The semiconductor chips 30 are provided at positions surrounded with the multiple semiconductor chips 10. The multiple semiconductor chips 30 are provided to be adjacent to each other. Similarly to the semiconductor device 100, the temperature increase of the semiconductor device 200 during operation can be suppressed by providing the semiconductor chips 10 further on the outer perimeter side of the semiconductor device 200 than the semiconductor chips 30.

Effects of the second embodiment will now be described with reference to the semiconductor device according to the reference example.

Figure 16:
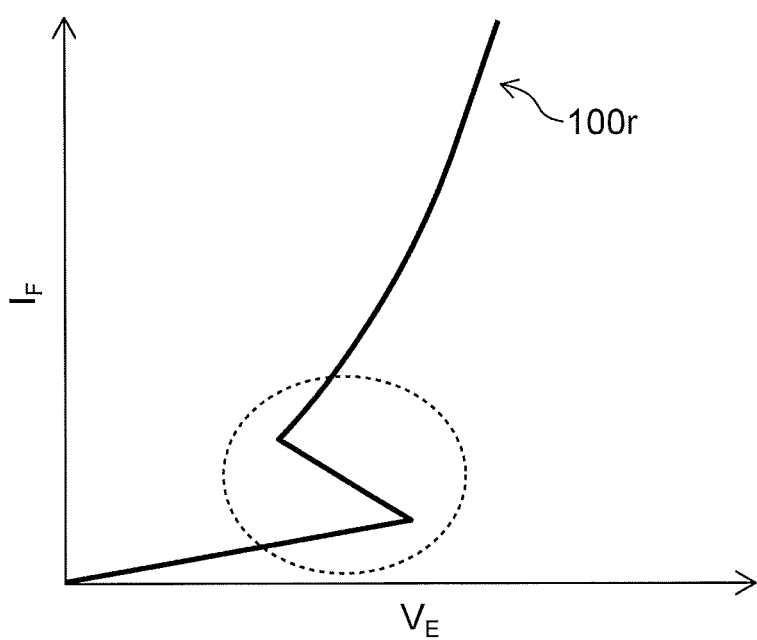
FIG. 16 is a graph illustrating a characteristic of a semiconductor device according to a reference example.

FIG. 16 is a graph illustrating a characteristic of the semiconductor device according to the reference example.

Figures 17A, 17B:
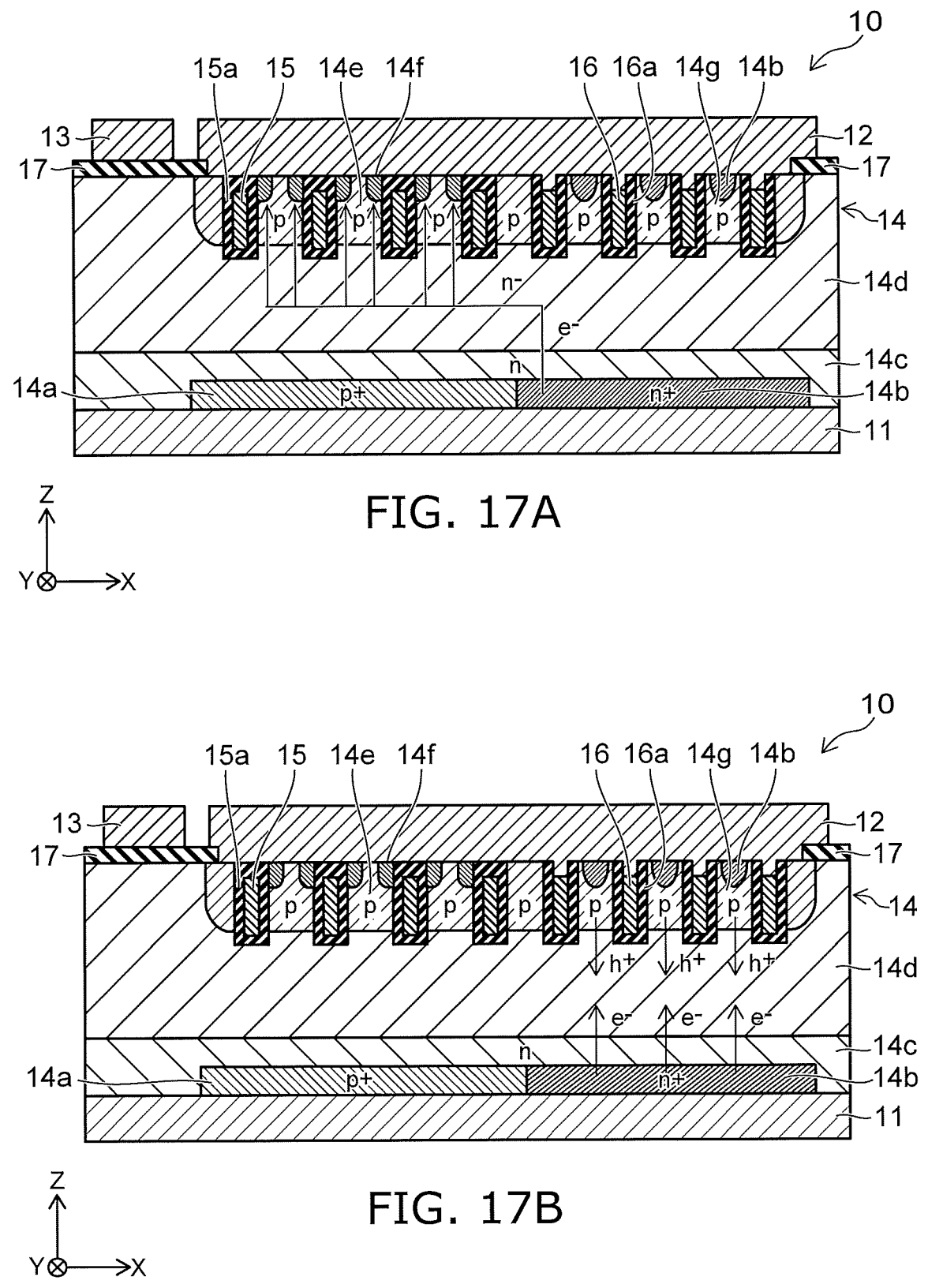

FIGS. 17A and 17B are cross-sectional views illustrating operations of the semiconductor device according to the reference example.

The case is considered where a bridge circuit is configured using multiple semiconductor devices 100r according to the reference example illustrated in FIG. 5. In the bridge circuit, when one semiconductor device 100r is switched from the ON-state to the OFF-state, an induced electromotive force is applied to the second metal plate 42 (the emitter electrode 12) of another semiconductor device 100r. A freewheeling current flows in the semiconductor chips 10 due to the induced electromotive force. FIG. 16 illustrates the characteristic of the semiconductor device 100r at this time.

In FIG. 16, the horizontal axis is a voltage $V_E$ with respect to the collector electrode 11 applied to the emitter electrode 12. The vertical axis is a freewheeling current $I_F$ flowing from the emitter electrode 12 toward the collector electrode 11. In the case of the semiconductor device 100r according to the reference example, snapback occurs as in the portion surrounded with the dotted line of FIG. 16 when the voltage $V_E$ increases to some magnitude. In the snapback, the current $I_F$ increases; and the voltage $V_E$ decreases abruptly.

The snapback illustrated in FIG. 16 occurs because the semiconductor chip 10 is an RC-IGBT. When the induced electromotive force is applied to the emitter electrode 12 of the semiconductor chip 10, there are cases where the potential of the gate electrode 15 is the threshold or more due to noise generated by the gate electrode 15, etc. In such a case, as illustrated in FIG. 17A, electrons flow through the channel of the p-type base region 14e from the collector electrode 11 to the emitter electrode 12. When the electrons flow from the collector electrode 11 to the emitter electrode 12, a large potential difference between the collector electrode 11 and the emitter electrode 12 is not generated easily. The potential difference between the $n^-$-type drift region 14d and the p-type anode region 14g does not reach or exceed the built-in potential easily. As a result, holes are not injected into the $n^-$-type drift region 14d; and conductivity modulation does not occur in the $n^-$-type drift region 14d. An operation of MOS mode occurs instead of a diode operation in the semiconductor chip 10.

Subsequently, when the voltage $V_E$ increases, the potential difference between the $n^-$-type drift region 14d and the p-type anode region 14g reaches or exceeds the built-in potential. As illustrated in FIG. 17B, the holes are injected from the p-type anode region 14g; and the electrical resistance of the semiconductor device 100r decreases. The current $I_F$ increases; the voltage $V_E$ decreases; and snapback such as that illustrated in FIG. 16 occurs.

The power consumption of the operation of MOS mode illustrated in FIG. 17A is large compared to that of the diode operation illustrated in FIG. 17B. Accordingly, the power consumption of the semiconductor device increases when the operation of MOS mode occurs.

The semiconductor device 200 according to the second embodiment includes the semiconductor chip 30 in addition to the semiconductor chip 10. The semiconductor chip 30 is a diode. As illustrated in FIG. 14, the semiconductor chip 30 has a structure in which holes are injected during operation. An operation of MOS mode such as that illustrated in FIG. 17A does not occur in the semiconductor chip 30.

When the electrons do not flow from the cathode electrode 31 to the anode electrode 32, the potential difference between the cathode electrode 31 and the anode electrode 32 increases by that amount. The potential difference between the $n^-$-type drift region 34d and the p-type anode region 34g decreases. As a result, in the semiconductor chip 30, the holes are injected from the p-type anode region 34g into the $n^-$-type drift region 34d even in the state in which the voltage applied to the semiconductor device 200 is low; and conductivity modulation occurs. The current flows mainly through the semiconductor chip 30 having the low electrical resistance; and the operation of MOS mode of the semiconductor chip 10 is suppressed. Subsequently, as the voltage $V_E$ increases, the holes are injected into the n⁻-type drift region 14d in the semiconductor chip 10 as well; and conductivity modulation occurs. According to the semiconductor device 200 according to the embodiment, the occurrence of an operation of MOS mode such as that of the semiconductor device 100r according to the reference example when the freewheeling current flows can be suppressed.

Figure 18A:
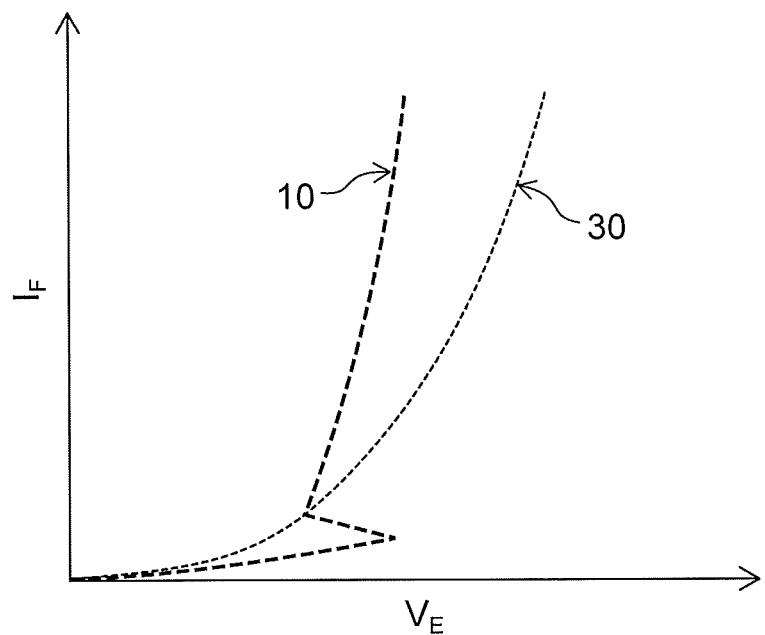
FIG. 18A and FIG. 18B are graphs illustrating characteristics of the semiconductor device according to the second embodiment.
Figure 18B:
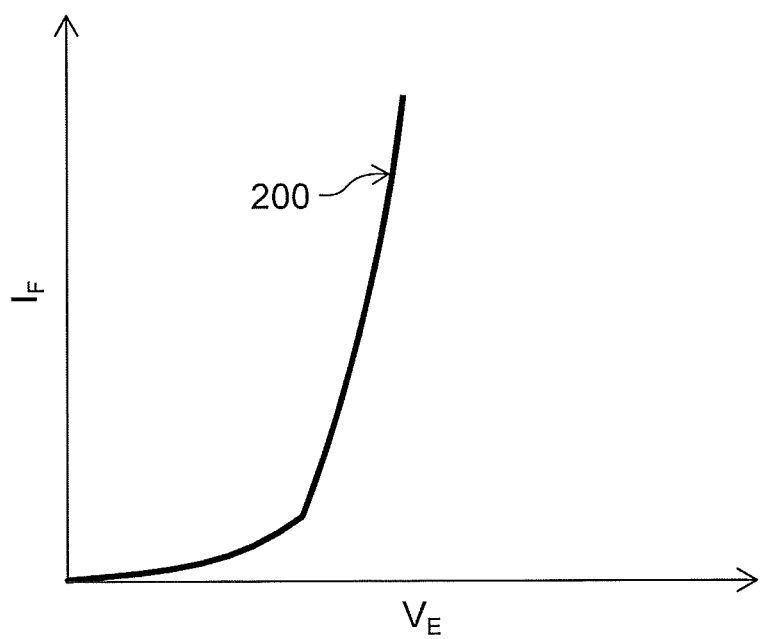

FIG. 18A and FIG. 18B are graphs illustrating characteristics of the semiconductor device according to the second embodiment.

In FIG. 18A and FIG. 18B, the horizontal axis is the voltage $V_E$; and the vertical axis is the current $I_F$. FIG. 18A illustrates the characteristics of the semiconductor chip 10 and the semiconductor chip 30. FIG. 18B illustrates the characteristic of the entire semiconductor device 200.

As illustrated in FIG. 18A and FIG. 18B, the characteristic of the semiconductor device 200 is substantially the combination of the portions of the characteristics of the semiconductor chip 10 and the semiconductor chip 30, the portions having lower resistances. According to the second embodiment as illustrated in FIG. 18B, the occurrence of the operation of MOS mode and the snapback of the semiconductor device 200 is suppressed; and it is possible to reduce the power consumption of the semiconductor device 200.

The semiconductor chip 30 may be a Schottky barrier diode instead of the p-n junction diode illustrated in FIG. 14. In such a case, the anode electrode 32 includes a metal having a large work function such as Al, AlSi, etc.; and the n⁻-type drift region 34d and the anode electrode 32 have a Schottky contact.

Figure 19A:
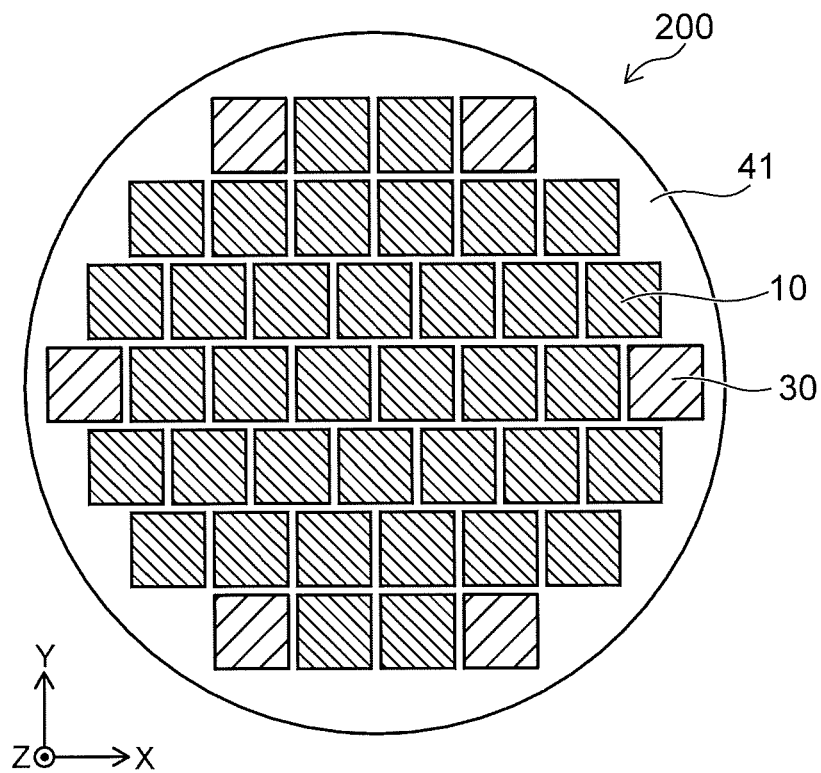
FIG. 19A to FIG. 20 are plan views illustrating arrangements of the semiconductor chips of the semiconductor device according to the second embodiment.
Figure 19B:
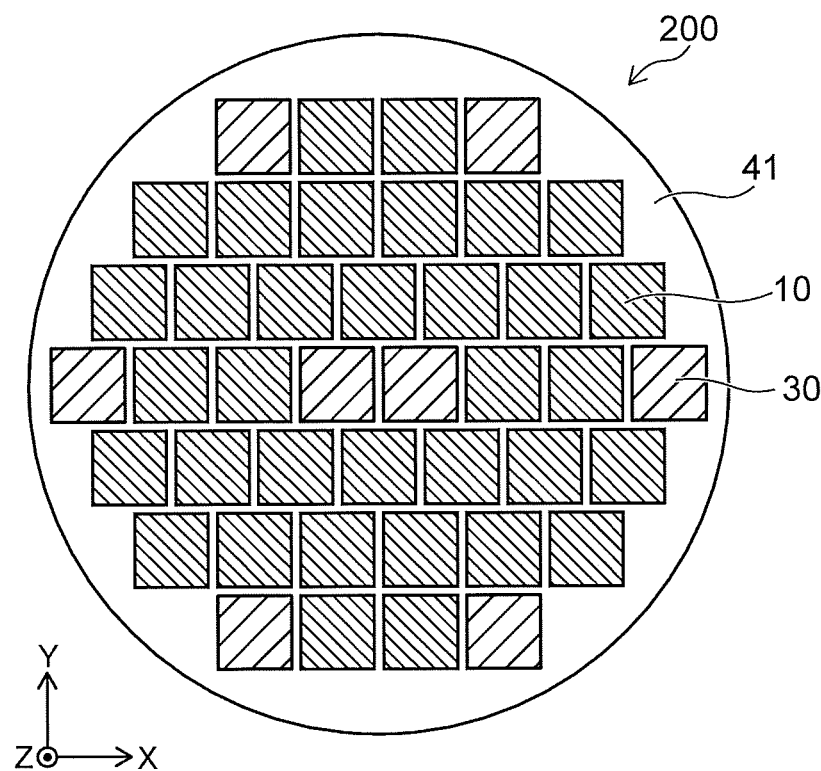
Figure 20:
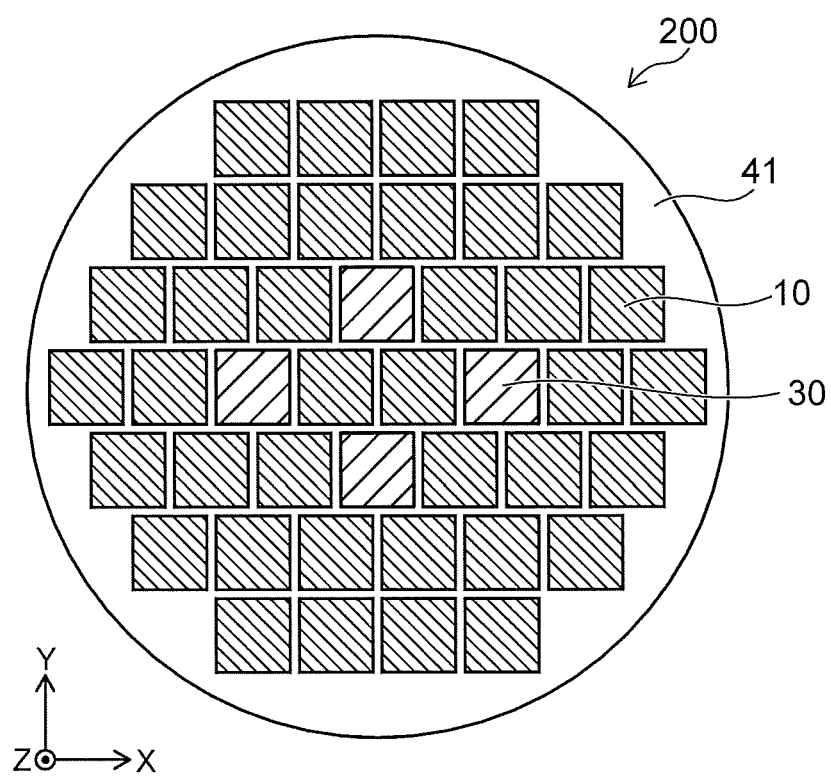

FIG. 19A to FIG. 20 are plan views illustrating arrangements of the semiconductor chips of the semiconductor device according to the second embodiment.

Arrangement examples of the semiconductor chips that are different from that of FIG. 13 are illustrated in FIG. 19A to FIG. 20. As illustrated in FIG. 19A, the multiple semiconductor chips 30 may be provided to be separated from each other at the outer perimeter of the semiconductor device 200. As illustrated in FIG. 19B, the semiconductor chips 30 may be provided at both the center and the outer perimeter of the semiconductor device 200. Or, as illustrated in FIG. 20, the multiple semiconductor chips 30 may be provided to be separated from each other at middle portions between the center and the outer perimeter of the semiconductor device 200. In these arrangements as well, the occurrence of the operation of MOS mode and the snapback of the semiconductor device 200 is suppressed; and it is possible to reduce the power consumption of the semiconductor device 200.

Third Embodiment

Figure 21:
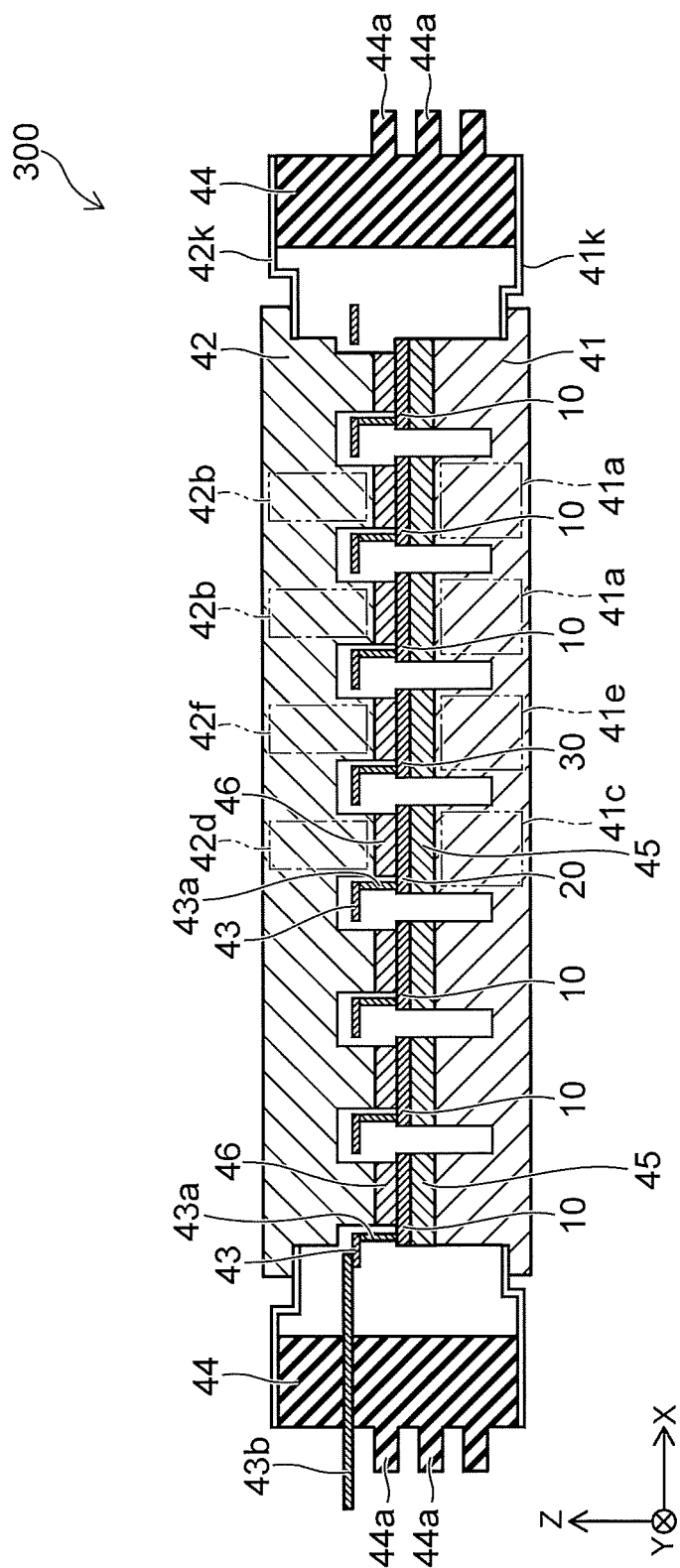
FIG. 21 is a cross-sectional view illustrating a semiconductor device according to a third embodiment.

FIG. 21 is a cross-sectional view illustrating a semiconductor device according to a third embodiment.

As illustrated in FIG. 21, the semiconductor device 300 according to the third embodiment includes the semiconductor chip 10, the semiconductor chip 20, and the semiconductor chip 30.

The first metal plate 41 includes the first electrically conductive portion 41a, the third electrically conductive portion 41c, and a fifth electrically conductive portion 41e. The second metal plate 42 includes the second electrically conductive portion 42b, the fourth electrically conductive portion 42d, and a sixth electrically conductive portion 42f.

The collector electrode 11 (the first electrode) and the emitter electrode 12 (the second electrode) of the semiconductor chip 10 (the first semiconductor chip) are electrically connected respectively to the first electrically conductive portion 41a and the second electrically conductive portion 42b. The collector electrode 21 (the third electrode) and the emitter electrode 22 (the fourth electrode) of the semiconductor chip 20 (the second semiconductor chip) are electrically connected respectively to the third electrically conductive portion 41c and the fourth electrically conductive portion 42d. The cathode electrode 31 (the fifth electrode) and the anode electrode 32 (the sixth electrode) of the semiconductor chip 30 (a third semiconductor chip) are electrically connected respectively to the fifth electrically conductive portion 41e and the sixth electrically conductive portion 42f.

By providing the semiconductor chips 10 to 30, the occurrence of the snapback illustrated in both FIG. 6 and FIG. 16 can be suppressed. In other words, according to the semiconductor device 300 according to the third embodiment, the power consumption in the ON-state in which the current flows from the first metal plate 41 toward the second metal plate 42 can be reduced; and the power consumption in the freewheeling state in which the current flows from the second metal plate 42 toward the first metal plate 41 can be reduced.

Figure 22:
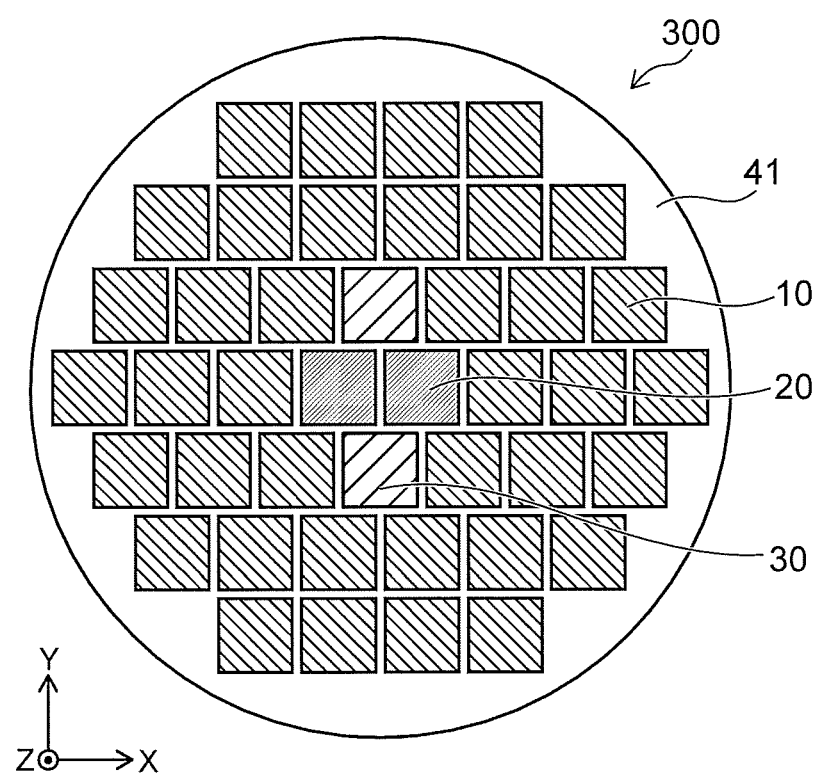
FIG. 22 is a plan view illustrating an arrangement of semiconductor chips of the semiconductor device according to the third embodiment.

FIG. 22 is a plan view illustrating an arrangement of the semiconductor chips of the semiconductor device according to the third embodiment.

The semiconductor chips 10 to 30 are marked with mutually-different hatching in FIG. 22. In the example illustrated in FIG. 22, the arrangement of the semiconductor chips 20 and 30 is different from the example illustrated in FIG. 21.

In the semiconductor device 300, for example, as illustrated in FIG. 22, the number of the semiconductor chips 10 is more than the number of the semiconductor chips 20 and more than the number of the semiconductor chips 30. The semiconductor chips 20 and the semiconductor chips 30 are provided at positions surrounded with the multiple semiconductor chips 10. By providing the semiconductor chips 10 further on the outer perimeter side of the semiconductor device 300 than the semiconductor chips 20 and the semiconductor chips 30, similarly to the semiconductor device 100, the temperature increase of the semiconductor device 300 during operation can be suppressed.

Modification

Figure 23A:
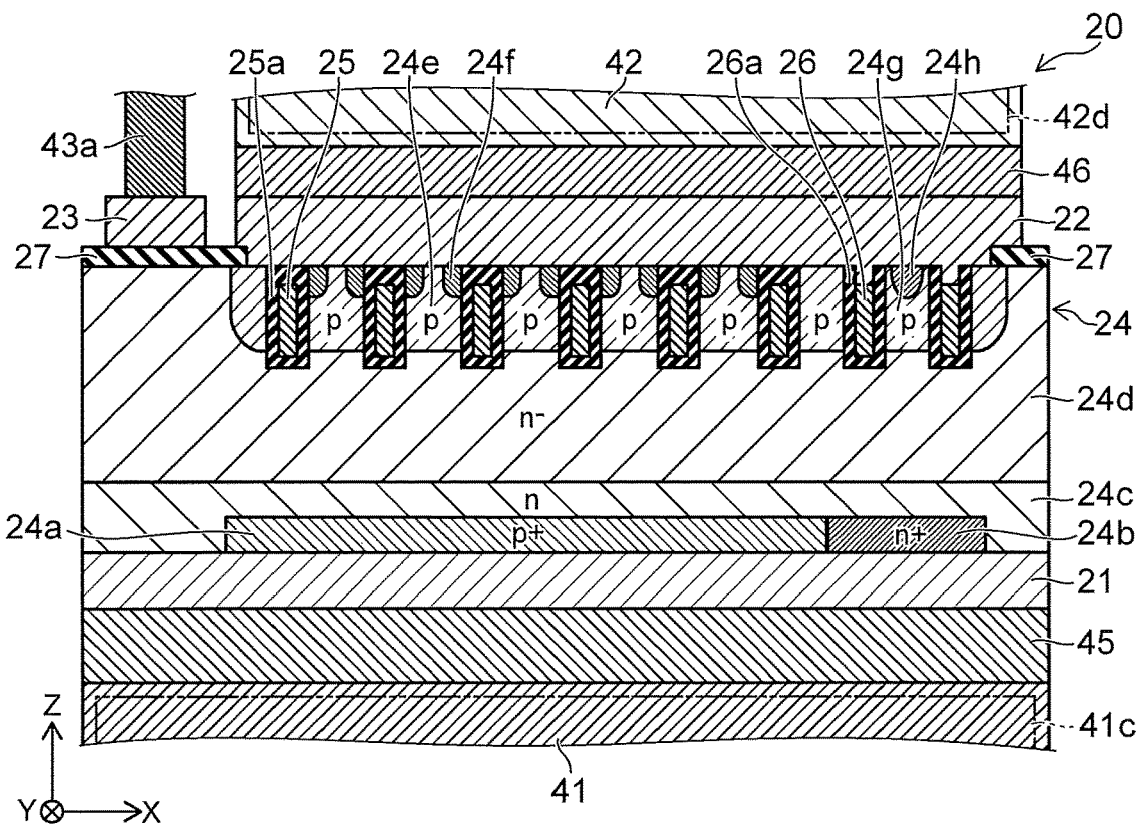
FIGS. 23A and 23B are cross-sectional views illustrating semiconductor chips of a semiconductor device according to a modification of the third embodiment.
Figure 23B:
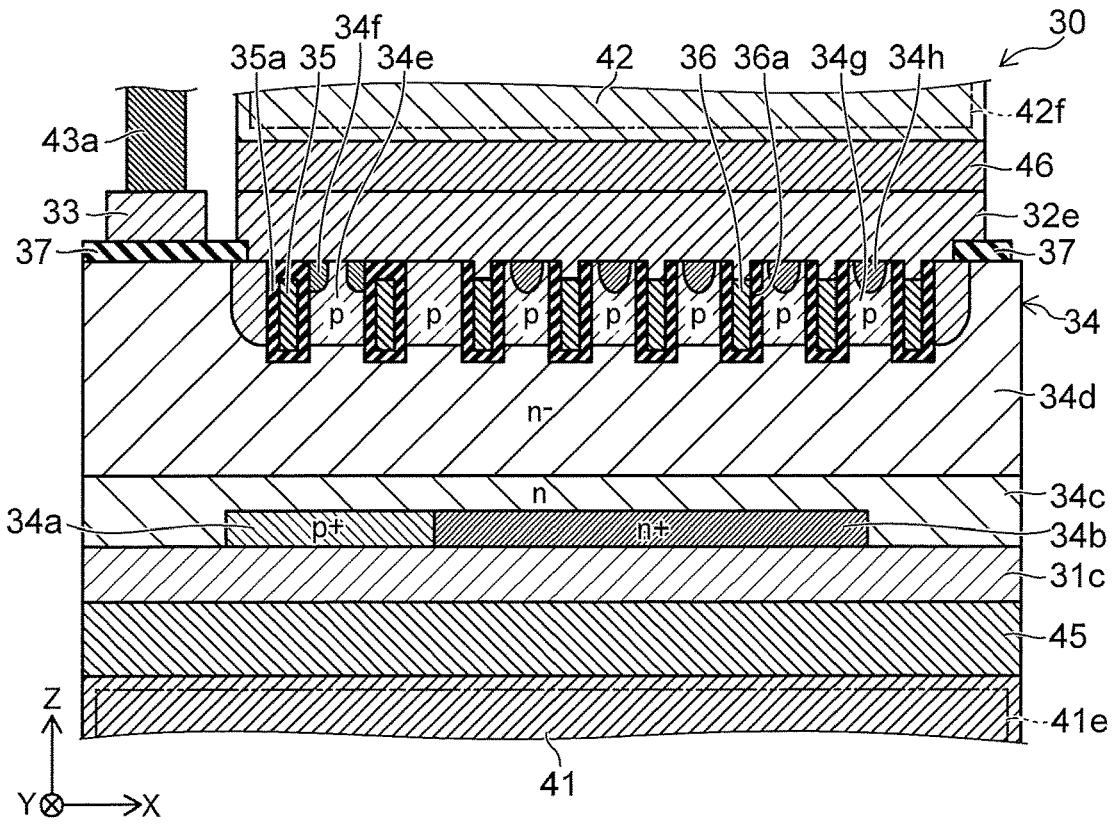

FIGS. 23A and 23B are cross-sectional views illustrating semiconductor chips of a semiconductor device according to a modification of the third embodiment.

FIG. 23A and FIG. 23B respectively illustrate the semiconductor chip 20 and the semiconductor chip 30. In the semiconductor device according to the modification, all of the semiconductor chips 10 to 30 are RC-IGBTs.

For example, the structure of the semiconductor chip 10 is the same as the structure illustrated in FIG. 2.

In the semiconductor chip 20, for example, as illustrated in FIG. 23A, the semiconductor portion 24 includes the p⁺-type collector region 24a, an n⁺-type cathode region 24b, the n-type buffer region 24c, the n⁻-type drift region 24d, the p-type base region 24e, the n⁺-type emitter region 24f, a p-type anode region 24g, and a p⁺-type anode region 24h. An electrically conductive portion 26 opposes the p-type anode region 24g with an insulating layer 26a interposed.

For example, as illustrated in FIG. 23B, the semiconductor chip 30 includes a collector electrode 31c, an emitter electrode 32e, a gate pad 33, the semiconductor portion 34, a gate electrode 35, and an electrically conductive portion 36. The collector electrode 31c and the emitter electrode 32e are electrically connected respectively to the fifth electrically conductive portion 41e and the sixth electrically conductive portion 42f. The gate pad 33 is electrically connected to the gate electrode 35 and is electrically connected to the metal plate 43 via the pin 43a.

The semiconductor portion 34 includes, for example, a $p^+$-type collector region 34a, the $n^+$-type cathode region 34b, an n-type buffer region 34c, the $n^-$-type drift region 34d, a p-type base region 34e, an $n^+$-type emitter region 34f, the p-type anode region 34g, and the $p^+$-type anode region 34h. The functions of the components of the semiconductor portion 34 are respectively substantially the same as the functions of the components of the semiconductor portion 14.

Although all of the semiconductor chips 10 to 30 are RC-IGBTs, the ratios of the surface area of the region operating as the IGBT and the surface area of the region operating as the diode are different from each other. For example, the ratio of the surface area of the $p^+$-type collector region 14a and the surface area of the $n^+$-type cathode region 14b of the semiconductor chip 10, the ratio of the surface area of the $p^+$-type collector region 24a and the surface area of the $n^+$-type cathode region 24b of the semiconductor chip 20, and the ratio of the surface area of the $p^+$-type collector region 34a and the surface area of the $n^+$-type cathode region 34b of the semiconductor chip 30 are different from each other.

For example, in the semiconductor chip 20, compared to the semiconductor chip 10, the surface area of the IGBT is large; and the surface area of the diode is small. In other words, the semiconductor chip 20 operates as an IGBT more easily than does the semiconductor chip 10. In the semiconductor chip 30, compared to the semiconductor chip 10, the surface area of the diode is large; and the surface area of the IGBT is small. The semiconductor chip 30 operates as a diode more easily than does the semiconductor chip 10.

When the semiconductor chips 10 to 30 are set to the ON-state, operations of MOS mode such as that illustrated in FIG. 7A occur in the semiconductor chips 10 to 30. In the semiconductor chip 20, because the surface area of the diode is small, the potential difference between the $p^+$-type collector region 24a and the n-type buffer region 24c decreases more easily than in the semiconductor chip 10 and the semiconductor chip 30. Therefore, in the semiconductor chip 20, the IGBT operation occurs faster than in the semiconductor chip 10 and the semiconductor chip 30. As a result, the snapback in the ON-state is suppressed.

Similarly, when the semiconductor chips 10 to 30 are in the freewheeling state, operations of MOS mode such as that illustrated in FIG. 17A occur in the semiconductor chips 10 to 30. In the semiconductor chip 30, because the surface area of the IGBT is small, the potential difference between the $n^-$-type drift region 14d and the p-type anode region 14g decreases more easily than in the semiconductor chip 10 and the semiconductor chip 20. Therefore, in the semiconductor chip 30, the diode operation occurs faster than in the semiconductor chip 10 and the semiconductor chip 20. As a result, the snapback in the freewheeling state is suppressed.

According to the semiconductor device according to the modification, similarly to the semiconductor device 300, the snapback in the ON-state and the freewheeling state can be suppressed; and the power consumption can be reduced.

The structures of the semiconductor chips of the modification are applicable similarly to the semiconductor devices according to the first embodiment and the second embodiment. In other words, in the semiconductor device 100 according to the first embodiment, the semiconductor chip 20 may have the structure illustrated in FIG. 23A instead of the structure illustrated in FIG. 3. In the semiconductor device 200 according to the second embodiment, the semiconductor chip 30 may have the structure illustrated in FIG. 23B instead of the structure illustrated in FIG. 14. Even in such cases, the snapback in the ON-state or the freewheeling state can be suppressed; and the power consumption can be reduced.

To reduce the power consumption further, it is desirable for the semiconductor chip 20 to have only the function of the IGBT. It is desirable for the semiconductor chip 30 to have only the function of the diode.

FIG. 24A to FIG. 26B are plan views illustrating arrangements of the semiconductor chips of the semiconductor device according to the third embodiment.

Figure 24A:
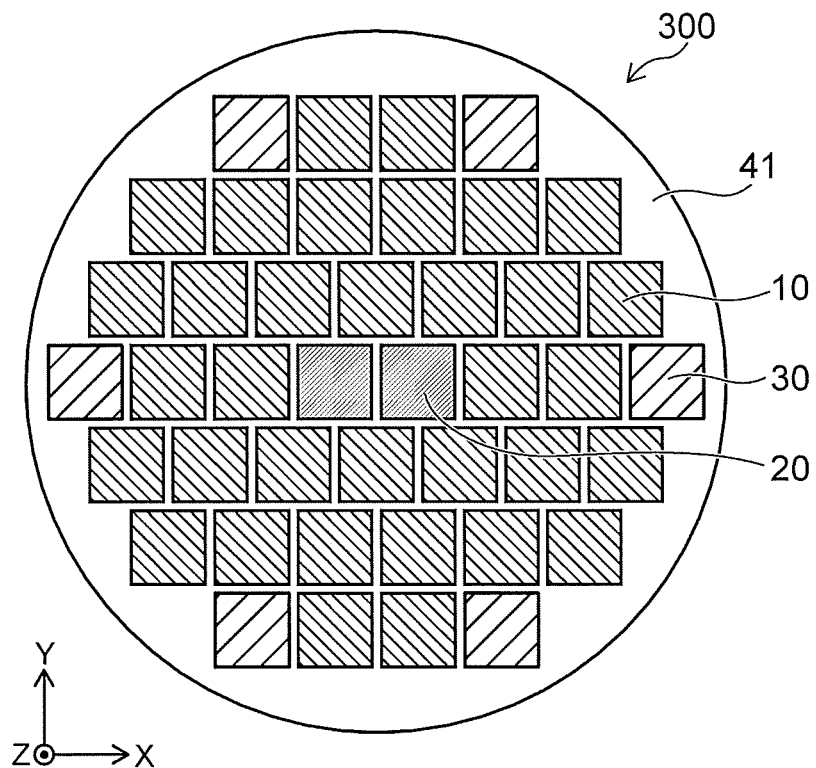
FIG. 24A to FIG. 26B are plan views illustrating arrangements of the semiconductor chips of the semiconductor device according to the third embodiment.
Figure 24B:
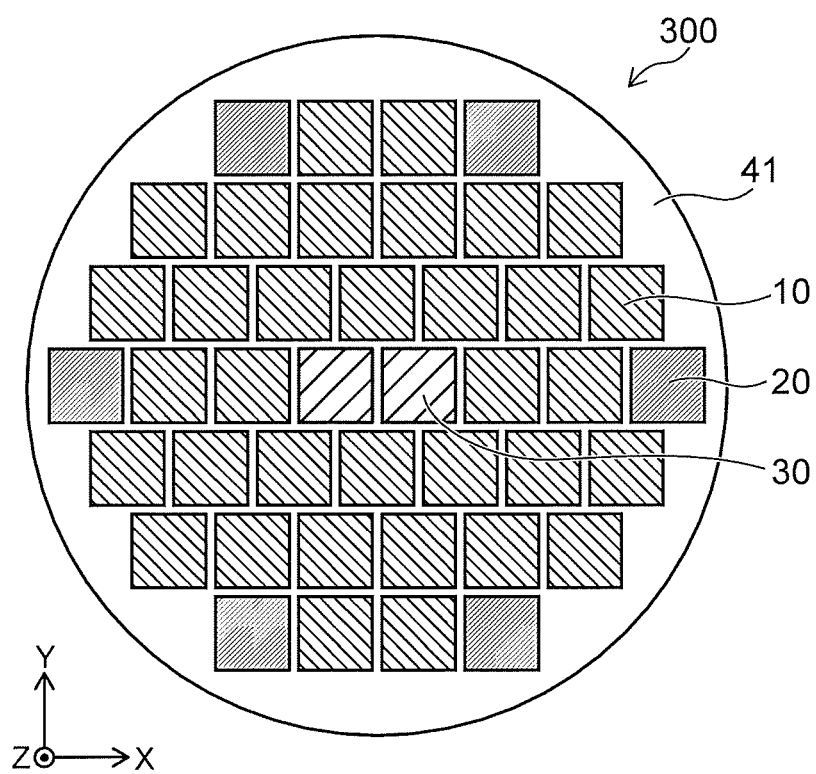

FIG. 24A to FIG. 26B illustrate arrangement examples of the semiconductor chips that are different from the one of FIG. 22. As illustrated in FIG. 24A, the multiple semiconductor chips 20 may be provided at the center of the semiconductor device 300; and the multiple semiconductor chips 30 may be provided to be separated from each other at the outer perimeter of the semiconductor device 300. As illustrated in FIG. 24B, the multiple semiconductor chips 30 may be provided at the center of the semiconductor device 300; and the multiple semiconductor chips 20 may be provided to be separated from each other at the outer perimeter of the semiconductor device 300.

Figure 25A:
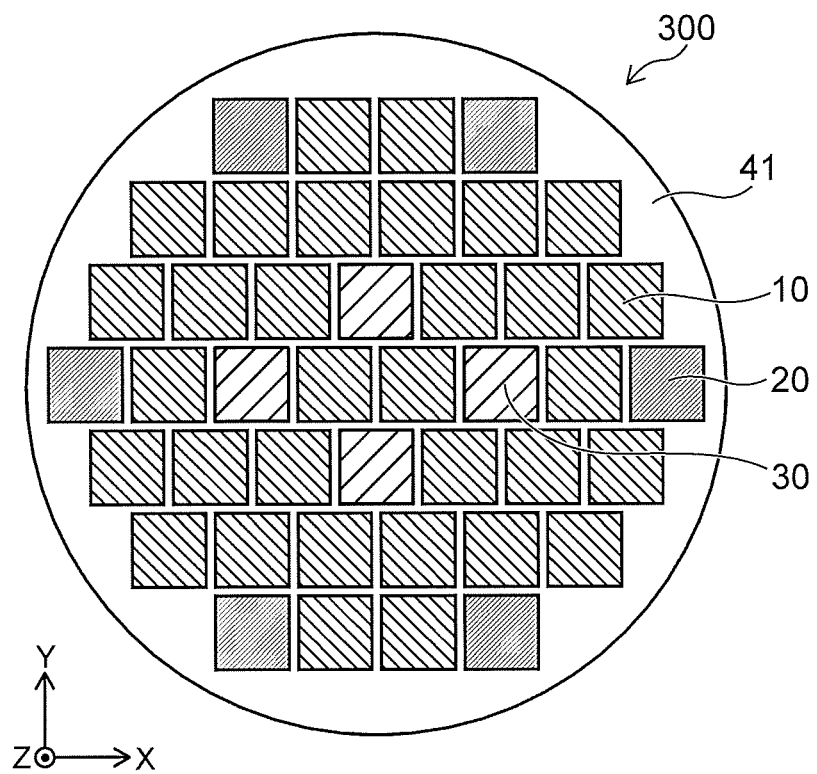
Figure 25B:
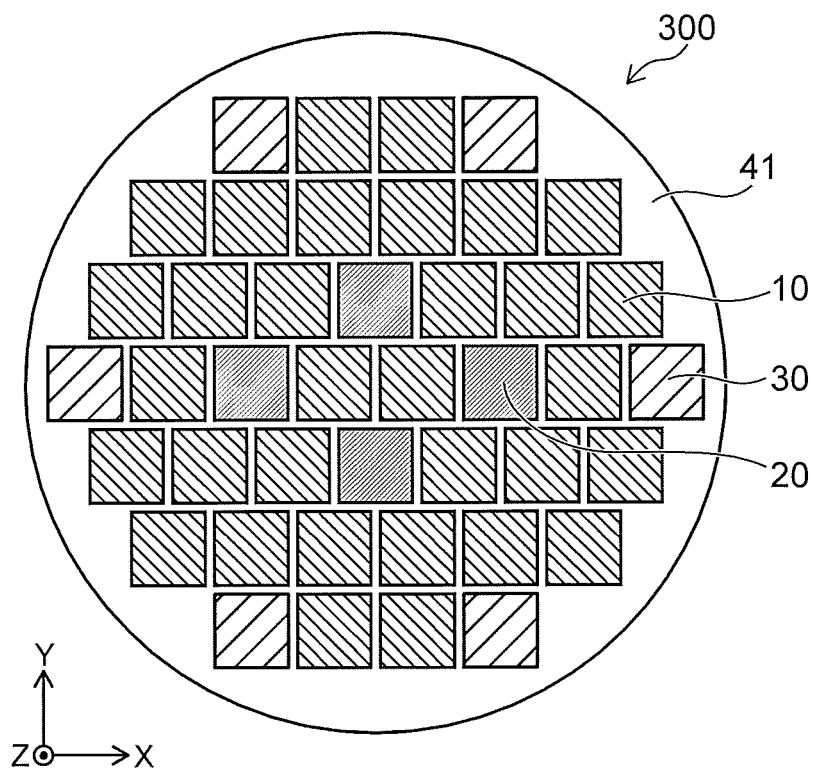

As illustrated in FIG. 25A, the multiple semiconductor chips 20 may be provided to be separated from each other at the outer perimeter of the semiconductor device 300; and the multiple semiconductor chips 30 may be provided to be separated from each other at middle portions between the center and the outer perimeter of the semiconductor device 300. As illustrated in FIG. 25B, the multiple semiconductor chips 30 may be provided to be separated from each other at the outer perimeter of the semiconductor device 300; and the multiple semiconductor chips 20 may be provided to be separated from each other at middle portions between the center and the outer perimeter of the semiconductor device 300.

Figure 26A:
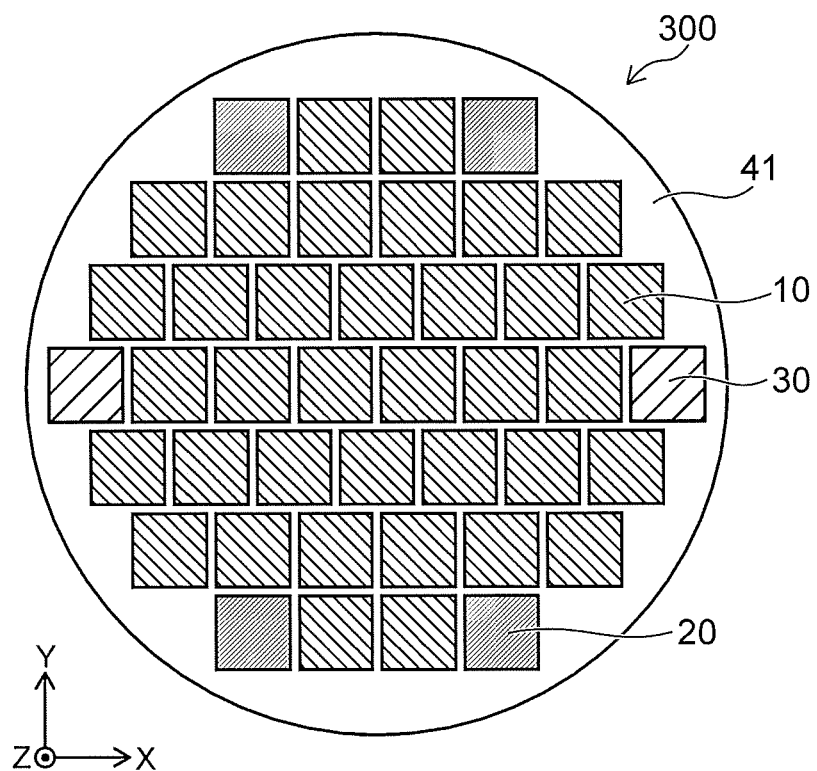
Figure 26B:
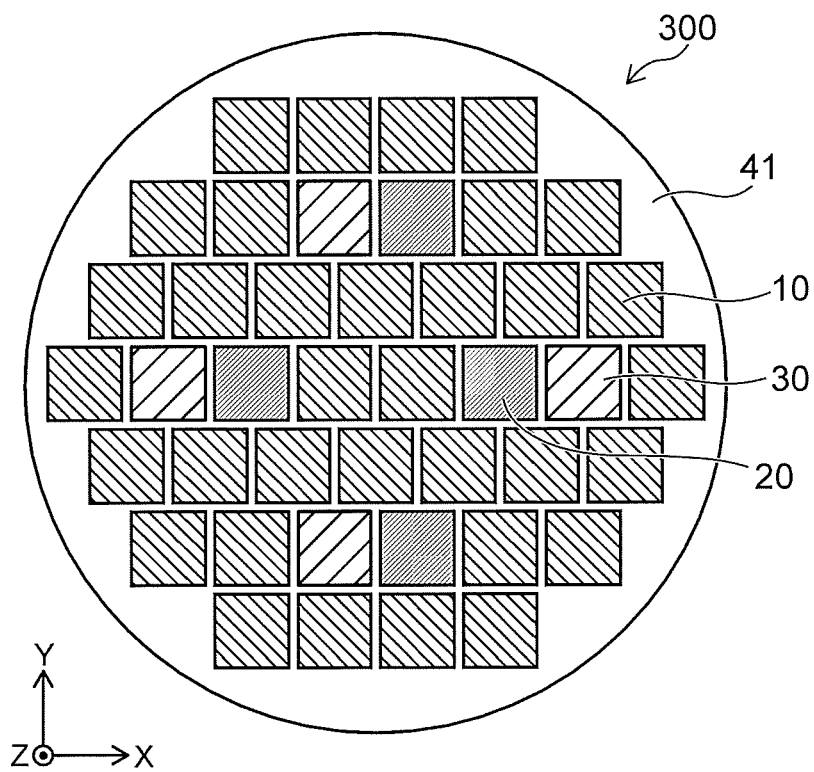

As illustrated in FIG. 26A, the multiple semiconductor chips 20 and the multiple semiconductor chips 30 may be provided to be separated from each other at the outer perimeter of the semiconductor device 300. As illustrated in FIG. 26B, the multiple semiconductor chips 20 and the multiple semiconductor chips 30 may be provided to be separated from each other at middle portions between the center and the outer perimeter of the semiconductor device 300.

Fourth Embodiment

Figure 27:
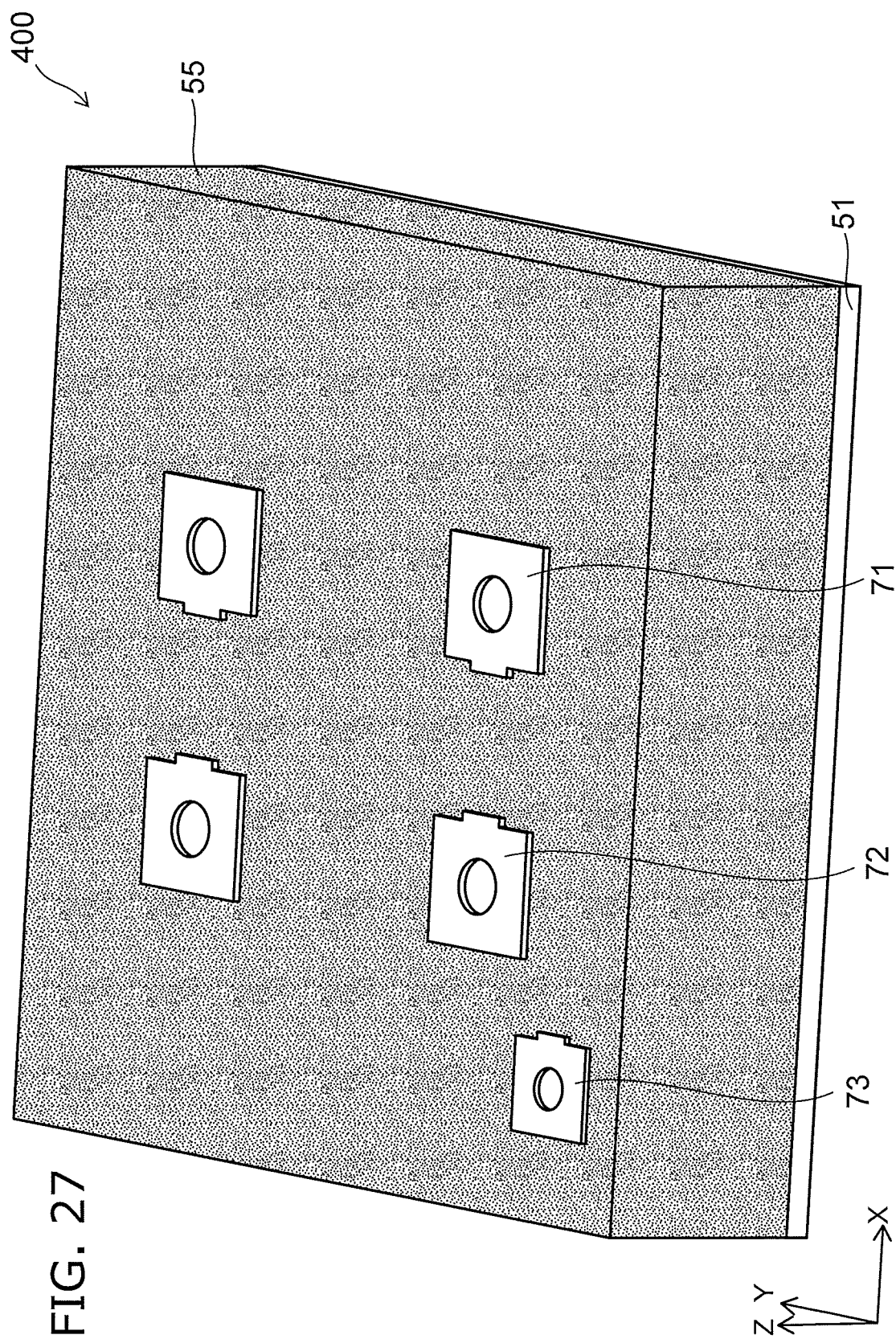
FIG. 27 and FIG. 28 are perspective views illustrating a semiconductor device according to a fourth embodiment.
Figure 28:
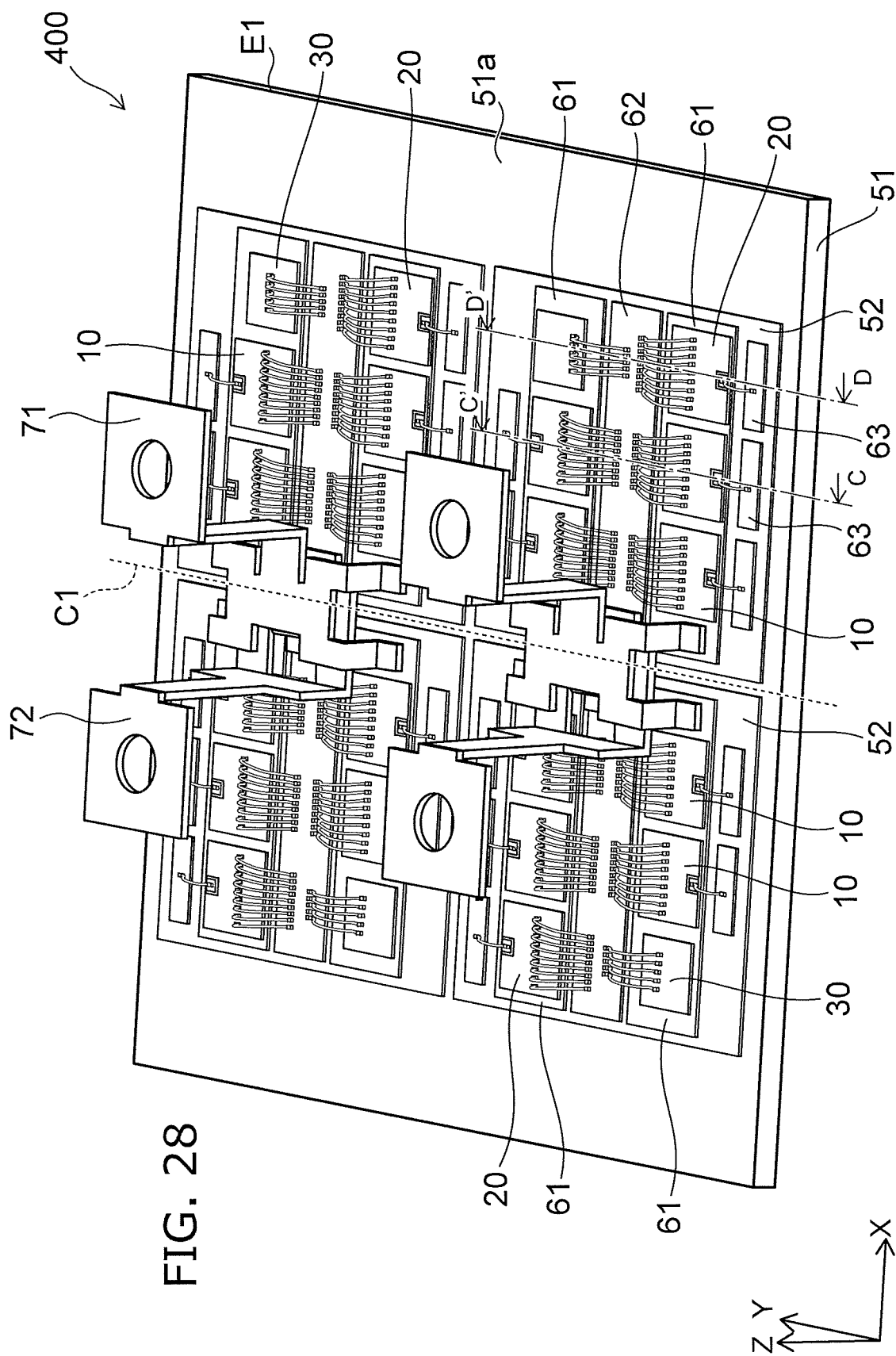

FIG. 27 and FIG. 28 are perspective views illustrating a semiconductor device according to a fourth embodiment.

Figure 29A:
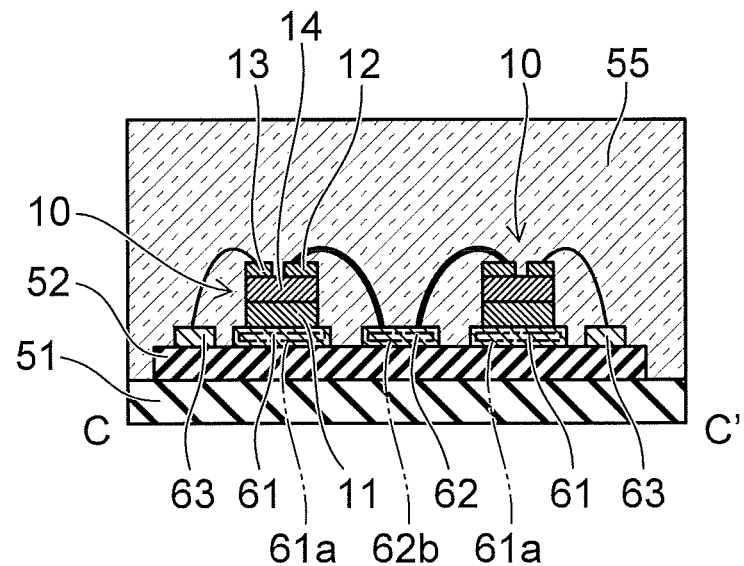
FIG. 29A and FIG. 29B are respectively a C-C' cross-sectional view and a D-D' cross-sectional view of FIG. 28.
Figure 29B:
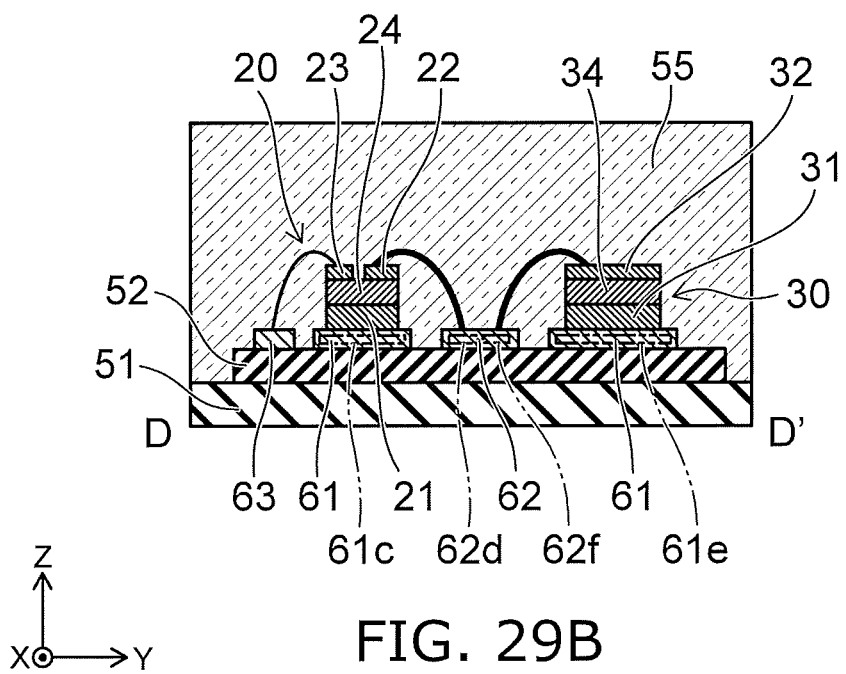

FIG. 29A and FIG. 29B are respectively a C-C' cross-sectional view and a D-D' cross-sectional view of FIG. 28.

A sealing portion 55 and a third terminal 73 are not illustrated in FIG. 28 to illustrate the internal structure of the semiconductor device.

As illustrated in FIG. 27, the semiconductor device 400 includes a first substrate 51, the sealing portion 55, a first terminal 71, a second terminal 72, and the third terminal 73. The sealing portion 55 seals the components mounted on the first substrate 51. The first to third terminals 71 to 73 are terminals for electrically connecting the semiconductor device 400 to an external power supply and are exposed outside the sealing portion 55.

As illustrated in FIG. 28, the semiconductor device 400 further includes the semiconductor chip 10, the semiconductor chip 20, the semiconductor chip 30, a second substrate 52, a first metal layer 61, a second metal layer 62, and a third metal layer 63. The semiconductor chip 10 is an RC-IGBT. The semiconductor chip 20 is an IGBT. The semiconductor chip 30 is a diode connected in anti-parallel with the semiconductor chip 10 and the semiconductor chip 20.

The first substrate 51 has a first surface 51a parallel to the X-direction and the Y-direction. The multiple second substrates 52 are provided to be separated from each other on the first surface 51a of the first substrate 51. The multiple first metal layers 61, the second metal layer 62, and the multiple third metal layers 63 are provided to be separated from each other on the second substrate 52. These metal layers may be provided on the first substrate 51 directly without interposing the second substrate 52.

In the example illustrated in FIG. 28, the semiconductor chips 10 and one of the semiconductor chip 20 or the semiconductor chip 30 are provided on each of the first metal layers 61. The semiconductor chips 10 to 30 may be provided on each of the first metal layers 61. In other words, each of the first metal layers 61 includes a first electrically conductive portion 61a electrically connected to the semiconductor chip 10 and at least one of a third electrically conductive portion 61c electrically connected to the semiconductor chip 20 or a fifth electrically conductive portion 61e electrically connected to the semiconductor chip 30. The numbers of the semiconductor chips 10 to 30 provided on the first metal layer 61 are arbitrary.

A pair of first metal layers 61, the second metal layer 62, and a pair of semiconductor chips 10 that are provided on the second substrate 52 are illustrated in FIG. 29A. As illustrated in FIG. 29A, each of the first metal layers 61 includes the first electrically conductive portion 61a. The semiconductor chip 10 is provided on the first electrically conductive portion 61a; and the collector electrode 11 is electrically connected to the first electrically conductive portion 61a. The second metal layer 62 includes a second electrically conductive portion 62b. The emitter electrode 12 is electrically connected to the second electrically conductive portion 62b. The gate pad 13 is electrically connected to the third metal layer 63.

A pair of first metal layers 61 and the second metal layer 62 are illustrated in FIG. 29B. These metal layers are the same as the metal layers illustrated in FIG. 29A. As illustrated in FIG. 29B, one of the pair of first metal layers 61 includes the third electrically conductive portion 61c in addition to the first electrically conductive portion 61a. The other one of the pair of first metal layers 61 includes the fifth electrically conductive portion 61e in addition to the first electrically conductive portion 61a. The second metal layer 62 includes a fourth electrically conductive portion 62d and a sixth electrically conductive portion 62f in addition to the second electrically conductive portion 62b.

The semiconductor chip 20 is provided on the third electrically conductive portion 61c; and the collector electrode 21 is electrically connected to the third electrically conductive portion 61c. The emitter electrode 22 is electrically connected to the fourth electrically conductive portion 62d. The gate pad 23 is electrically connected to the third metal layer 63.

The semiconductor chip 30 is provided on the fifth electrically conductive portion 61e of the first metal layer 61; and the cathode electrode 31 is electrically connected to the fifth electrically conductive portion 61e. The anode electrode is electrically connected to the other sixth electrically conductive portion 62f of the second metal layer 62 recited above.

In the example illustrated in FIG. 28 to FIG. 29B, a portion of the multiple first metal layers 61 includes the first electrically conductive portion 61a and the third electrically conductive portion 61c; and the semiconductor chip 10 and the semiconductor chip 20 are provided on the portion of the multiple first metal layers 61. Another portion of the multiple first metal layers 61 includes the first electrically conductive portion 61a and the fifth electrically conductive portion 61e; and the semiconductor chip 10 and the semiconductor chip 30 are provided on the other portion of the multiple first metal layers 61.

As illustrated in FIG. 28, the multiple first metal layers 61 that are electrically connected to the semiconductor chips 10 to 30 are electrically connected to each other by the first terminal 71. The first electrically conductive portion 61a, the third electrically conductive portion 61c, and the fifth electrically conductive portion 61e are electrically connected to each other and are set to the same potential. The multiple second metal layers 62 are electrically connected to each other by the second terminal 72. The second electrically conductive portion 62b, the fourth electrically conductive portion 62d, and the sixth electrically conductive portion 62f are electrically connected to each other and are set to the same potential. The multiple third metal layers 63 are electrically connected to the third terminal 73 via a not-illustrated printed circuit board.

The first substrate 51 includes an insulating material such as AlSiC, etc. The second substrate 52 includes an insulating material such as AlN, etc. The sealing portion 55 includes an insulating resin such as a silicone resin, etc. The first metal layer 61, the second metal layer 62, and the third metal layer 63 include a metal material such as copper, etc. The first terminal 71, the second terminal 72, and the third terminal 73 include a metal material such as copper, etc.

As described above, the semiconductor device 400 includes the RC-IGBT semiconductor chip 10, the IGBT semiconductor chip 20, and the diode semiconductor chip 30. According to the embodiment, similarly to the third embodiment, the occurrence of the snapback in the ON-state and the freewheeling state can be suppressed; and the power consumption of the semiconductor device can be reduced.

Figure 30:
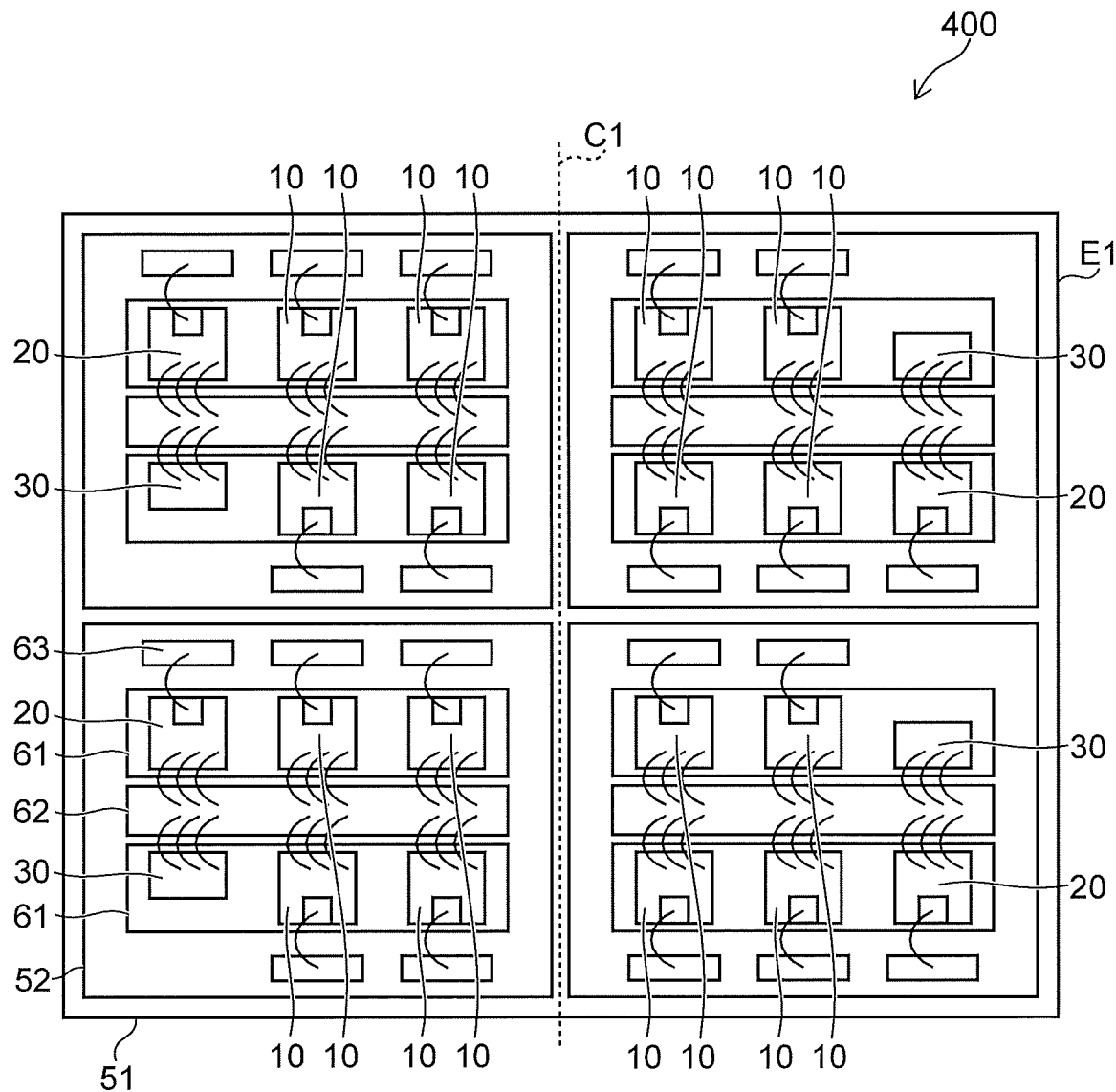
FIG. 30 and FIG. 31 are plan views illustrating arrangements of semiconductor chips of the semiconductor device according to the fourth embodiment.
Figure 30:
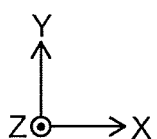
Figure 31:
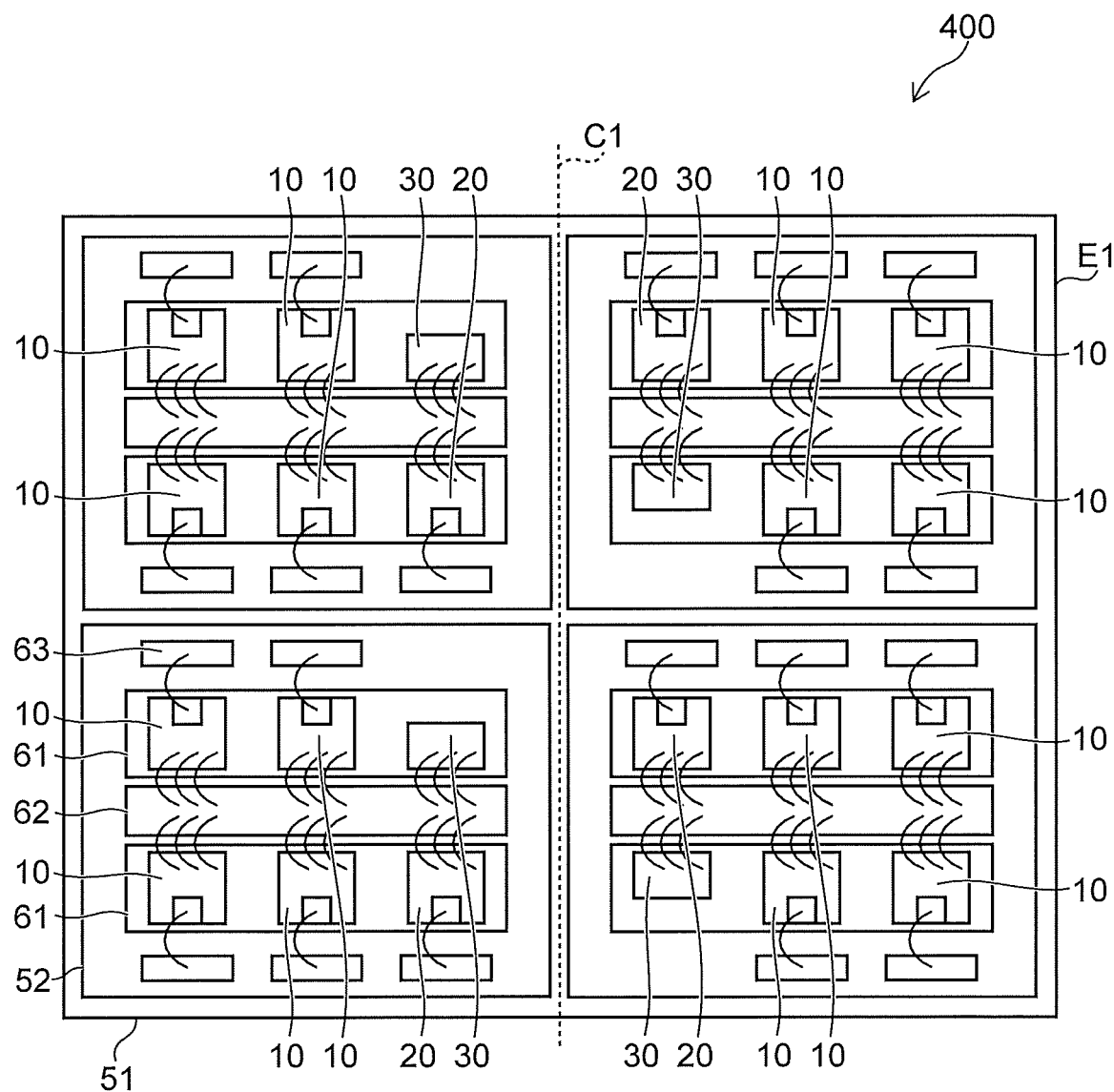

FIG. 30 and FIG. 31 are plan views illustrating arrangements of the semiconductor chips of the semiconductor device according to the fourth embodiment.

The arrangement of the semiconductor chips of the semiconductor device illustrated in FIG. 28 is schematically illustrated in FIG. 30. For example, on one first metal layer 61, the semiconductor chip 20 or the semiconductor chip 30 is provided further on the outer perimeter side of the semiconductor device 400 than the semiconductor chips 10. Specifically, the semiconductor device 400 has a center C1 in the X-direction (a first direction) and one end E1 in the X-direction. A portion of the multiple semiconductor chips 10, a portion of the multiple semiconductor chips 20, and a portion of the multiple semiconductor chips 30 are provided between the center C1 and the end E1. In these semiconductor chips, the distance in the X-direction between the end E1 and the semiconductor chip 20 or the semiconductor chip 30 is shorter than the distance in the X-direction between the semiconductor chip 10 and the end E1.

Or, as illustrated in FIG. 31, on one first metal layer 61, the semiconductor chip 10 may be provided further on the outer perimeter side of the semiconductor device 400 than the semiconductor chip 20 or the semiconductor chip 30. The distance in the X-direction between the semiconductor chip 10 and the end E1 may be shorter than the distance in the X-direction between the end E1 and the semiconductor chip 20 or the semiconductor chip 30. According to this configuration, the heat of the semiconductor chip 10 having larger heat generation can be released outside the semiconductor device 400 efficiently; and the temperature increase of the semiconductor device 400 can be suppressed.

In the semiconductor chip 20, heat is generated only in the ON-state. In the semiconductor chip 30, heat is generated only in the freewheeling state. In the case where the multiple semiconductor chips 20 and the multiple semiconductor chips 30 are provided in the semiconductor device 400, it is desirable for the semiconductor chips 20 to be separated from each other and for the semiconductor chips 30 to be separated from each other.

For example, as illustrated in FIG. 28, FIG. 30, and FIG. 31, on the two second substrates 52 adjacent to each other in the X-direction, it is desirable for the multiple semiconductor chips 20 to be positioned at opposite corners. It is desirable for the multiple semiconductor chips 30 to be positioned at other opposite corners. The semiconductor chip 20 and the semiconductor chip 30 oppose each other in the Y-direction. According to this configuration, the increase of the temperature of the semiconductor device 400 locally in the ON-state or the freewheeling state can be suppressed.

It is possible to confirm the relative levels of the impurity concentrations of the semiconductor regions in the embodiments described above, for example, using a SCM (scanning capacitance microscope). The carrier concentrations of the semiconductor regions may be considered to be equal to the activated impurity concentrations of the semiconductor regions. Accordingly, the relative levels of the carrier concentrations of the semiconductor regions can be confirmed using SCM. It is possible to measure the impurity concentrations of the semiconductor regions, for example, using a SIMS (secondary ion mass spectrometer).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:
a first electrically conductive portion;
a first semiconductor chip, the first semiconductor chip including
a first electrode electrically connected to the first electrically conductive portion, and
a second electrode provided on a side opposite to the first electrode;
a second electrically conductive portion electrically connected to the second electrode;
a third electrically conductive portion electrically connected to the first electrically conductive portion, a potential of the third electrically conductive portion being set to be the same as a potential of the first electrically conductive portion;
a second semiconductor chip, the second semiconductor chip including
a third electrode electrically connected to the third electrically conductive portion, and
a fourth electrode provided on a side opposite to the third electrode; and
a fourth electrically conductive portion electrically connected to the fourth electrode and the second electrically conductive portion, a potential of the fourth electrically conductive portion being set to be the same as a potential of the second electrically conductive portion.

2. The device according to claim 1, comprising:
a first metal plate including the first electrically conductive portion and the third electrically conductive portion; and
a second metal plate including the second electrically conductive portion and the fourth electrically conductive portion,
the first semiconductor chip and the second semiconductor chip being provided between the first metal plate and the second metal plate.

3. The device according to claim 2, further comprising a frame provided around the first semiconductor chip and the second semiconductor chip, the frame being interposed between an outer perimeter of the first metal plate and an outer perimeter of the second metal plate,
the first semiconductor chip and the second semiconductor chip being sealed by the first metal plate, the second metal plate, and the frame.

4. The device according to claim 3, wherein
a plurality of the first semiconductor chips and a plurality of the second semiconductor chips are provided between the first metal plate and the second metal plate, and
a number of the first semiconductor chips is more than a number of the second semiconductor chips.

5. The device according to claim 1, comprising:
a first metal layer including the first electrically conductive portion and the third electrically conductive portion; and
a second metal layer including the second electrically conductive portion and the fount electrically conductive portion and being separated from the first metal layer,
the first semiconductor chip and the second semiconductor chip being provided on the first metal layer.

6. The device according to claim 5, wherein
the first semiconductor chip and the second semiconductor chip are provided to be separated from each other in a first direction on the first metal layer,
the first semiconductor chip and the second semiconductor chip are provided between a center in the first direction of the semiconductor device and one end in the first direction of the semiconductor device, and
a distance in the first direction between the second semiconductor chip and the one end is shorter than a distance in the first direction between the first semiconductor chip and the one end.

7. The device according to claim 5, wherein
a plurality of the first semiconductor chips is provided on the first metal layer, and
on the first metal layer, a number of the first semiconductor chips is more than a number of the second semiconductor chips.

8. The device according to claim 1, further comprising:
a fifth electrically conductive portion electrically connected to the first electrically conductive portion and the third electrically conductive portion, a potential of the fifth electrically conductive portion being set to be the same as a potential of the first electrically conductive portion and a potential of the third electrically conductive portion;
a third semiconductor chip of a diode, the third semiconductor chip including
    a fifth electrode electrically connected to the fifth electrically conductive portion, and
    a sixth electrode provided on a side opposite to the fifth electrode; and
a sixth electrically conductive portion electrically connected to the sixth electrode, the second electrically conductive portion, and the fourth electrically conductive portion, a potential of the sixth electrically conductive portion being set to be the same as the potential of the second electrically conductive portion and the potential of the fourth electrically conductive portion.

9. A semiconductor device, comprising:
a first electrically conductive portion;
a first semiconductor chip of a reverse-conducting insulated gate bipolar transistor, the first semiconductor chip including
    a first electrode electrically connected to the first electrically conductive portion, and
    a second electrode provided on a side opposite to the first electrode;
a second electrically conductive portion electrically connected to the second electrode;
a third electrically conductive portion electrically connected to the first electrically conductive portion, a potential of the third electrically conductive portion being set to be the same as a potential of the first electrically conductive portion;
a second semiconductor chip of a diode, the second semiconductor chip including
    a third electrode electrically connected to the third electrically conductive portion, and
    a fourth electrode provided on a side opposite to the third electrode; and
a fourth electrically conductive portion electrically connected to the fourth electrode and the second electrically conductive portion, a potential of the fourth electrically conductive portion being set to be the same as a potential of the second electrically conductive portion.

\* \* \* \* \*